(12) United States Patent
Kellerman et al.

(10) Patent No.: US 7,072,165 B2
(45) Date of Patent: *Jul. 4, 2006

(54) MEMS BASED MULTI-POLAR ELECTROSTATIC CHUCK

(75) Inventors: Peter L. Kellerman, Essex, MA (US); Shu Qin, Malden, MA (US); Douglas A. Brown, S. Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 353 days.

This patent is subject to a terminal disclaimer.

(21) Appl. No.: 10/642,939

(22) Filed: Aug. 18, 2003

(65) Prior Publication Data

US 2005/0041364 A1 Feb. 24, 2005

(51) Int. Cl.
*H01L 21/683* (2006.01)

(52) U.S. Cl. .................................. 361/234; 361/233
(58) Field of Classification Search ............... 361/234, 361/233

See application file for complete search history.

(56) References Cited

U.S. PATENT DOCUMENTS

| | | | |
|---|---|---|---|
| 3,566,959 A * | 3/1971 | Koltuniak et al. ......... 165/80.3 |
| 4,788,627 A * | 11/1988 | Ehlert et al. ................. 361/717 |
| 5,103,367 A | 4/1992 | Horwitz et al. |
| 5,117,121 A | 5/1992 | Watanabe et al. |
| 5,155,652 A * | 10/1992 | Logan et al. ................ 361/234 |
| 5,325,261 A | 6/1994 | Horwitz |
| 5,444,597 A | 8/1995 | Blake et al. |
| 5,452,177 A | 9/1995 | Frutiger |
| 5,583,736 A * | 12/1996 | Anderson et al. ........... 361/234 |
| 5,810,933 A * | 9/1998 | Mountsier et al. .......... 118/724 |
| 5,838,529 A | 11/1998 | Shufflebotham et al. |
| 5,841,624 A * | 11/1998 | Xu et al. ..................... 361/234 |
| 5,880,922 A * | 3/1999 | Husain ........................ 361/234 |
| 5,916,689 A | 6/1999 | Collins et al. |
| 5,958,813 A | 9/1999 | Aida et al. |
| 6,077,357 A * | 6/2000 | Rossman et al. ........... 118/728 |
| 6,117,246 A | 9/2000 | Parkhe et al. |
| 6,149,774 A | 11/2000 | Sun et al. |
| 6,215,643 B1 | 4/2001 | Nagasaki |
| 6,236,555 B1 | 5/2001 | Leeser |
| 6,378,600 B1 | 4/2002 | Moslehi |
| 6,388,861 B1 | 5/2002 | Frutiger |
| 6,414,834 B1 * | 7/2002 | Weldon et al. .............. 361/234 |
| 6,452,775 B1 * | 9/2002 | Nakajima .................... 361/234 |
| 2002/0173059 A1 * | 11/2002 | Ma ................................ 438/17 |

* cited by examiner

FOREIGN PATENT DOCUMENTS

JP 10-284583 A 10/1998

*Primary Examiner*—Phuong T. Vu
*Assistant Examiner*—Ann T. Hoang
(74) *Attorney, Agent, or Firm*—Eschweiler & Associates, LLC

(57) ABSTRACT

The present invention is directed to a semiconductor processing apparatus and a method for clamping a semiconductor substrate and controlling a heat transfer associated therewith. According to one aspect of the present invention, a multi-polar electrostatic chuck and associated method is disclosed which provides a controlled and uniform heat transfer coefficient across a surface thereof. The multi-polar electrostatic chuck comprises a semiconductor platform having a plurality of protrusions that define gaps therebetween, wherein a distance or depth of the gaps is uniform and associated with a mean free path of the cooling gas therein. The electrostatic chuck is permits a control of a backside pressure of a cooling gas within the plurality of gaps to thus control a heat transfer coefficient of the cooling gas. The plurality of protrusions further provide a uniform contact surface, wherein a contact conductivity between the plurality of protrusions and the substrate is controllable and significantly uniform across the substrate.

47 Claims, 20 Drawing Sheets

US 7,072,165 B2

MEMS BASED MULTI-POLAR ELECTROSTATIC CHUCK

FIELD OF THE INVENTION

The present invention relates generally to semiconductor processing systems, and more specifically to an apparatus and method for clamping a substrate and transferring thermal energy associated therewith.

BACKGROUND OF THE INVENTION

Processing of silicon wafers is commonplace in the manufacture of modern microelectronics devices. Such processing, including plasma processing and ion implantation may be performed at low pressures, wherein RF or microwave plasmas are delivered to the wafer, therein producing high temperatures at the wafer during processing. Such high temperatures (e.g., temperatures exceeding 400 C), however, can have deleterious effects on the wafer.

For many processes, precise temperature control is not required, as long as the wafer temperature remains at less than a predetermined limit, such as 400 C or below. Current trends in ion implantation, however, are tending toward high power serial implanters which generally require cooling with heat transfer coefficients HTC>200 mW/cm²C. In these and several other implant operations, a precise temperature control is typically required, wherein HTC uniformity across a 300 mm wafer, for example, needs to be maintained within 1%. Such processes can have an HTC value, for example, as high as 500 mW/cm²C. It is in meeting these high performance requirements that the current invention is directed.

Wafer temperature control in semiconductor processing has utilized electrostatic chucks (ESCs) for some time. A typical single-polar ESC is illustrated in FIG. 1, wherein the ESC 10 holds the wafer 20 in place by electrostatic force. The wafer 20 is separated from an electrode 30 by an insulating layer 40. A voltage (e.g., illustrated as a +) is applied to the electrode 30 by a voltage source 50. The voltage applied to the electrode produces an electrostatic field (e.g., illustrated as a "−") at the wafer 20 which induces an equal and opposite charge (e.g., illustrated as a +) on the wafer 20. The electrostatic field on the wafer 20 produces an electrostatic force between the wafer and the ESC 10. Consequently, the electrostatic force holds the wafer 20 against the insulating layer 40.

Cooling of the wafer 20 when utilizing ESCs can be provided by contact conductivity between the wafer and the contact surface 60 of the insulating layer 40, wherein the insulating layer may be cooled by cooling water. Conventionally, the cooling of the wafer 20 generally increases with the voltage applied to the ESC. Significantly high voltages, however, can have deleterious effects on the wafer (e.g., a cause of particle generation), and may further have costly power supply and consumption considerations, along with increased failure rates.

Other conventional ESCs utilize a cooling gas between the wafer 20 and the insulating layer 40, wherein a contact surface 60 of the insulating layer 40 comprises a plurality of protuberances (not shown), therein providing a region for the cooling gas to reside. Typically, a ceramic layer is conventionally machined to form protuberances therein, wherein the protuberances are formed by bead blasting. However, conventionally machining an insulating layer 40 comprised of a ceramic typically has several drawbacks, both in terms of precision, as well as potential particulate concerns caused by the ceramic layer during wafer processing.

Furthermore, it is typically very difficult to obtain a chuck surface flatness (i.e., control a waviness of the surface) of less than 5 microns across a 300 mm workpiece using conventional mechanical machining methods. For example, when the wafer contacts the conventional chuck surface, a gap width between chuck and wafer surfaces is typically within the 5 micron range due to the waviness of the chuck surface. This gap, however, is not uniform across wafer, and further varies depending on clamping conditions. Models and measurements indicate that, conventionally, an average gap width typically varies between 2.2 microns and 5 microns, depending on the surface and clamping conditions. This relatively large and uncontrollable gap width across the wafer typically results in a lower cooling capability and a non-uniform temperature across the wafer.

Still further, electrical connections to electrodes of the ESCs of the prior art have typically proven to be difficult to form. Conventionally, a wire is soldered beneath the electrodes in a center portion of the electrodes. Such soldering can disadvantageously perturb the heat conduction uniformity across the wafer.

Thus, there is a need in the art for an improved electrostatic chuck that provides a uniform HTC which is readily adjustable during processing, as well as a chuck which provides a higher thermal transfer ability in both cooling and heating of the wafer. Furthermore, a need exists for an electrostatic chuck that provides a clamping surface which is operable to significantly limit particulate contamination during wafer processing.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to a multi-polar electrostatic chuck and method for cooling a semiconductor substrate. The multi-polar electrostatic chuck, for example, comprises a clamping plate that is operable to efficiently clamp the substrate thereto, and to cool or heat the substrate in a generally uniform manner thereacross, thereby improving process control. According to one example, the clamping plate comprises a semiconductor platform, wherein a first electrically conductive layer is formed over a top surface thereof. The first electrically conductive layer further comprises a plurality of portions that are electrically isolated from one another, therein defining a plurality of poles or electrodes of the electrostatic chuck. In another example, the clamping plate further comprises a plurality of electrically insulative protrusions formed over the first electrically conductive layer. The plurality of protrusions generally define a plurality of valleys therebetween, and extend a first distance from a top surface of the clamping plate, therein defining a gap between the substrate and the top surface.

In a first embodiment, the electrostatic chuck is operable to exhibit backside pressure control of a cooling gas within the gap between the substrate and a top surface of the clamping plate. The gap between the substrate or wafer and the top surface is made quite small (e.g., less than about 1 micron), wherein a volume of the gas within the gap is small. The small gas volume provides for a fast response time (e.g., on the order of about 10 mS), thereby permitting a cooling of the wafer to be activated or deactivated expeditiously. For example, by changing the gas pressure within the gap from about 1 Torr to about 100 Torr, a heat transfer coefficient (HTC) can be controlled from a value less than about 2 mW/cm$^2$ C to a value greater than about 400 mW/cm$^2$ C. In addition, by establishing a small gap, gas conduction is substantially in the free molecular regime, wherein thermal conduction is independent of the gap and depends primarily on cooling gas pressure, which can be made substantially uniform across the wafer. Accordingly, in the first embodiment, the present invention advantageously provides a very fast turn-on of backside, free molecular regime gas conduction to a hot or cold chuck surface, wherein heating or cooling of the wafer is dictated primarily by the cooling gas pressure.

In another embodiment, the electrostatic chuck is operable to exhibit a high degree of heating or cooling of the substrate by thermal contact conductivity between the substrate and chuck, wherein the thermal conductivity is generally dependent on a contact pressure between the substrate and the plurality of protrusions. The plurality of protrusions, for example, are operable to generally transfer heat from the substrate to the clamping plate, wherein a uniformity of the plurality of protrusions is operable to provide a significantly higher degree of HTC uniformity across the wafer, as opposed to conventional ESCs. Furthermore, a voltage required to successfully operate the electrostatic chuck can be maintained at less than approximately 150V.

According to another exemplary aspect of the present invention, the multi-polar electrostatic chuck further comprises a base plate operable to transfer thermal energy from the substrate through the clamping plate. The base plate, for example, is comprised of a plurality of portions, wherein the plurality of portions of the base plate are electrically connected to the plurality of portions of the first electrically conductive layer. A second electrically conductive layer, for example, electrically connects the plurality of portions of the base plate to the plurality of portions of the first electrically conductive layer. A plurality of electrodes are electrically connected to the respective plurality of portions of the first electrically conductive layer, wherein the plurality of electrodes are further operable to be connected to a voltage source for the electrostatic chuck. For example, the plurality of electrodes are electrically connected to the first electrically conductive layer via the second electrically conductive layer and/or the base plate.

In accordance with yet another exemplary aspect of the present invention, the second electrically conductive layer comprises a plurality of vertical interconnects which electrically connect a bottom surface of the semiconductor platform to the first electrically conductive layer formed over the top surface of the semiconductor platform. The plurality of vertical interconnects, for example, comprise a plurality of vias generally extending through the semiconductor platform. Alternatively, the plurality of vertical interconnects are formed over a sidewall of the semiconductor platform, wherein the plurality of electrodes are electrically connected to the vertical interconnects via a plurality of spring-forced sidewall contact electrodes.

According to still another exemplary aspect of the invention, the clamping plate comprises one or more gas distribution grooves, wherein the one or more grooves are adapted to interconnect the plurality of valleys, wherein the cooling gas is operable to more quickly flow through the plurality of valleys. The distance which separates the substrate and the clamping plate, for example, is sized such that thermal conduction between the clamping plate and the substrate is generally permitted in the free molecular regime. The gas distribution grooves, however, are substantially larger than the gaps and permit gas flow in a viscous regime, thereby facilitating a quick transition to a cooling state. The electrostatic chuck may further comprise a temperature sensor for detecting a temperature associated with the substrate.

According to another exemplary aspect of the present invention, a method for cooling a substrate in a semiconductor processing system is disclosed, wherein the semiconductor processing system comprises a multi-polar electrostatic chuck. The method comprises placing the substrate on a surface having plurality of electrically insulative protrusions. The plurality of protrusions, for example, generally extend from a top surface of a clamping plate, therein defining a plurality of gaps. The clamping plate, for example, further comprises a first electrically conductive layer formed over a semiconductor platform, wherein the plurality of protrusions are formed thereover. A voltage is applied between two or more regions of the surface, such as by applying the voltage to two or more portions of the first electrically conductive layer, wherein the substrate is substantially clamped to the clamping plate via electrostatic force induced by the voltage. A pressure of a cooling gas residing between the plurality of protrusions is further controlled, wherein a heat transfer coefficient of the cooling gas is primarily a function of the pressure of the cooling gas.

According to still another exemplary aspect of the invention, a temperature associated with the substrate is measured, and a pressure of the cooling gas is controlled based, at least in part, on the measured temperature, whereby thermal conduction of heat in the molecular regime between the substrate and the clamping plate can be augmented. According to another example, the surface on which the substrate resides comprises one or more gas distribution grooves which are in fluid communication with the plurality of gaps, wherein the cooling gas is operable to flow within the one or more gas distribution grooves in a viscous regime, and wherein the pressure of the cooling gas is quickly controlled via the one or more gas distribution grooves.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
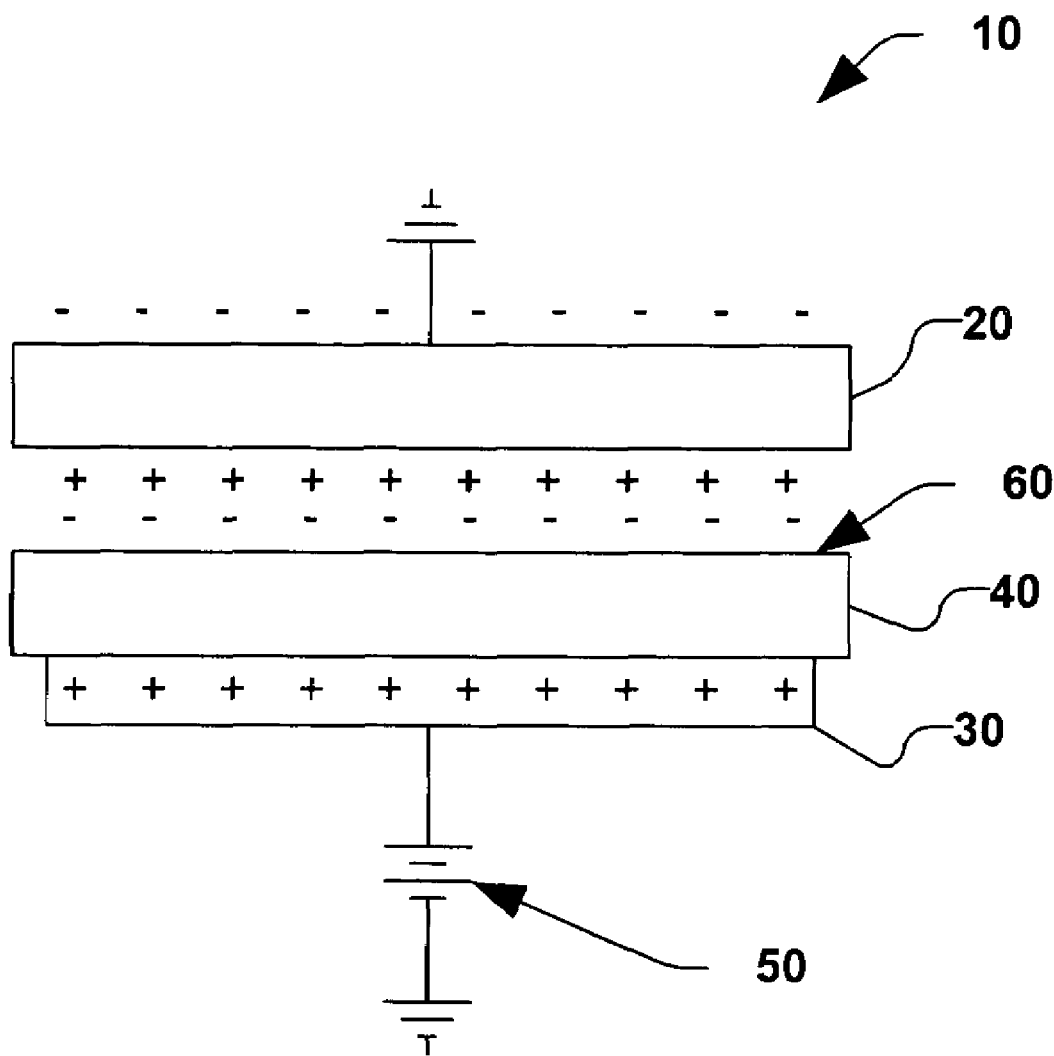
FIG. 1 is a partial cross-sectional view of an exemplary prior art electrostatic chuck.

The present invention is directed towards a multi-polar electrostatic chuck (ESC) and an associated system and method that incorporates several inventive features thereof. In particular, the electrostatic chuck of the present invention increases an ability to rapidly and uniformly cool or heat a wafer substrate, for example, during an ion implantation process. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention overcomes challenges of the prior art via a multi-polar electrostatic chuck (ESC) that exhibits a significantly uniform heat transfer coefficient (HTC) between a substrate (e.g., a silicon wafer) and a semiconductor clamping plate associated with the ESC. One approach to obtaining a significantly uniform HTC is to use backside gas conduction, such that the gas conduction between the wafer and the ESC is maintained in a molecular free regime. For example, a gap between the ESC and the wafer is such that the gap is significantly smaller than $\lambda_{mfp}$ (mean free path of a cooling gas, for example). In such a case, the HTC of the cooling gas is substantially independent of the gap, provided the gap remains significantly smaller than $\lambda_{mfp}$. It is thus desirable to make the gap as small as possible.

A practical limit to the gap dimension, however, is imposed by backside particles, since particles larger than a depth of the gap would cause a variation in the gap, thereby degrading reliability. Since most particles seen in a typical ESC are less than 1 micron, a lower limit of the gap in one example is approximately 1 micron. However, with systems having smaller particulate contaminants, smaller gaps may be employed, and such alternatives are contemplated by the present invention. However, in a pressure regime afforded by typical ESC clamping forces (which can be up to several hundred Torr), the mean free path of the gas is on the order of 1 micron. This means that the gas conduction is not totally within the molecular free regime, but is generally operating in a transition regime between the molecular free regime and a viscous regime. As a result, there is a moderate variation of HTC with the gap. For example, at 200 Torr, the HTC of an exemplary cooling gas is approximately 500 mW/cm² C, and a 100% variation of the gap (e.g., a gap ranging from 1 micron to 2 microns) will cause approximately a 20% variation in HTC. Therefore, in order to meet a desired 1% temperature uniformity across the wafer, the gap width uniformity should be less than or equal to 5%, in accordance with one aspect of the present invention.

In addition to gap uniformity, HTC uniformity is typically further dependent on pressure uniformity. A leakage of cooling gas at a perimeter of the wafer typically causes a gas flow, therein introducing a pressure gradient. This problem can be ameliorated by confining a region of gas flow to a region at or near the wafer perimeter and a network of gas distribution grooves, wherein the gas is operable to flow in a viscous regime, as will be described infra. A challenge arises to incorporate gas distribution grooves along with the surface structure that provides a uniform gap in such a way that provides easy and reliable manufacturing as well as avoiding the possibility of discharges.

Another challenge is to be able to achieve a control of the surface wherein obtaining a uniform gap and distribution grooves allows for the ESC to be multi-polar. Uni-polar clamps (e.g., wherein the entire ESC is one electrode) can be used in applications in which the wafer is exposed to a plasma, wherein a conductive path is created between the wafer and electrical ground. However, in applications wherein the wafer is not in constant contact with a plasma, a minimum of 2 electrodes is necessary wherein each electrode has an opposite polarity, thereby allowing the wafer to remain at virtual ground without an electrical connection through the wafer. Thus, a multi-polar electrostatic chuck is introduced which comprises precise surface control while allowing multiple electrodes to be incorporated therein and electrically connected to a power supply.

Figure 2:
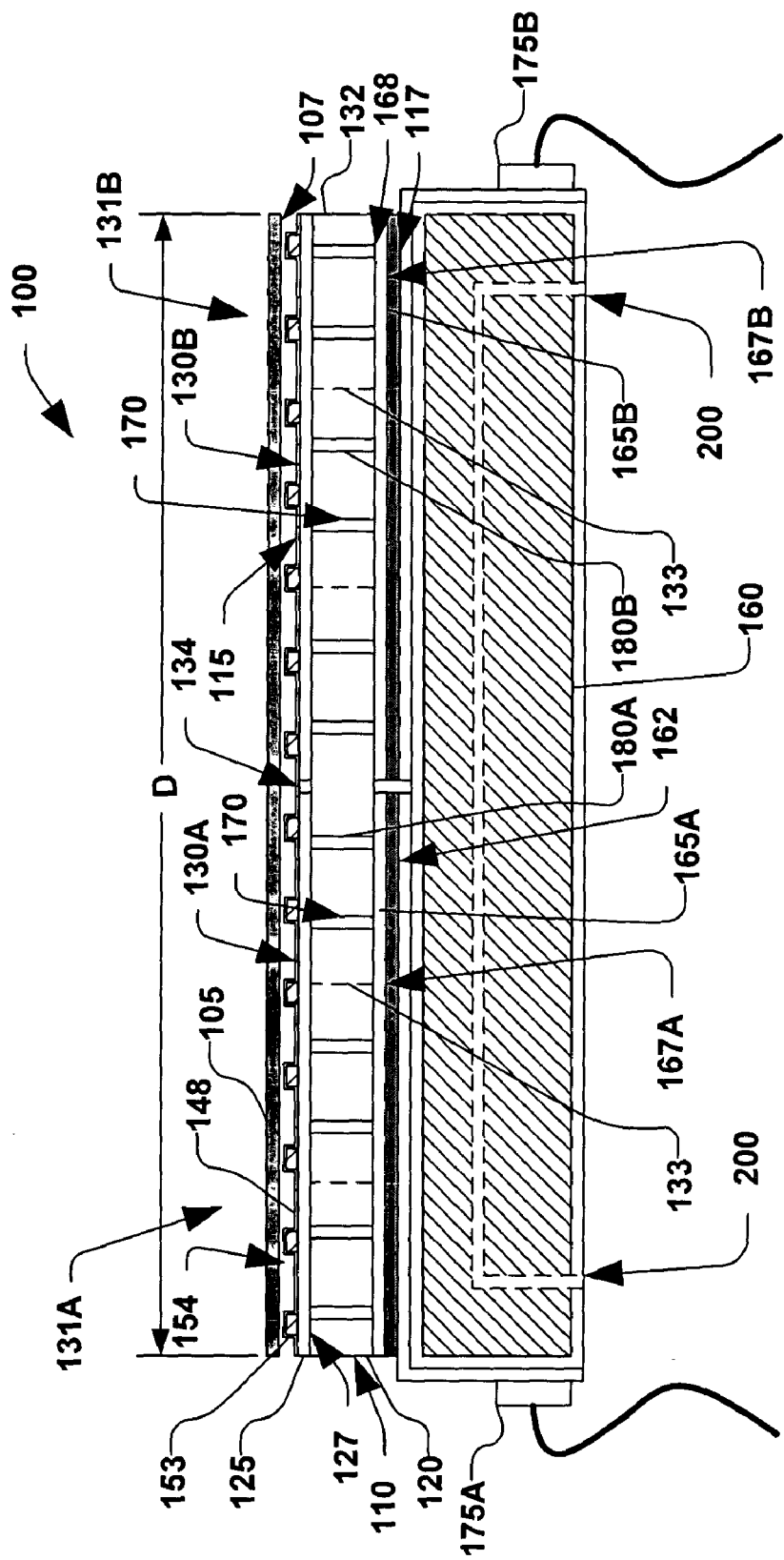
FIG. 2 is a partial cross-sectional view of an electrostatic chuck according to one exemplary aspect of the present invention.

Referring now to the figures, FIG. 2 of the present invention illustrates a cross-sectional view of an exemplary multi-polar ESC 100 according to one aspect of the invention, wherein the ESC is operable to support and cool a substrate 105 residing thereon. The substrate 105, for example, is generally characterized by a diameter D and a bottom surface 107, wherein the bottom surface has a first surface area (not shown) associated therewith. It should be noted that the electrostatic chuck 100 of FIG. 2 is illustrated macroscopically for simplicity, however, subsequent Figures (e.g., FIGS. 5, 6 and others) are provided which illustrate exemplary blown-up views of the electrostatic chuck 100 in further detail. Furthermore, it should be noted that wherein a cooling of the wafer or substrate is described, a heating of the substrate may alternatively be performed, and such heating is further contemplated as falling within the scope of the present invention.

The electrostatic chuck 100 of FIG. 2 of the present invention comprises a generally planar clamping plate 110 having a top surface 115 associated with the bottom surface 107 of the substrate 105 and an oppositely disposed bottom surface 117. The clamping plate 110, for example, comprises a semiconductor platform 120, wherein a first electrically conductive layer 125 is formed over a top surface 127 of the semiconductor platform. The first electrically conductive layer 125 is comprised of a plurality of portions 130, wherein the plurality of portions are generally electrically isolated from one another, therein defining a plurality of poles 131 of the multi-polar ESC 100, as will be discussed hereafter. The semiconductor platform 120, for example, comprises a semiconductor substrate 132, such as a silicon wafer, wherein the plurality of portions 130 of the first conductive layer 125 formed thereover are generally defined by an isolator region 134 between the plurality of portions 130. The isolator region 134 generally electrically isolates the plurality of portions 130 of the first electrically conductive layer 125 from one another, wherein a voltage applied to the plurality of portions 130 is operable to generate an electrostatic force between the clamping plate 110 and the substrate 105.

According to one exemplary aspect of the present invention, the clamping plate 110 is formed using semiconductor lithographic techniques, as will be described infra, wherein the isolator region 134, for example, is generally masked during the formation of the first electrically conductive layer 125. The semiconductor platform 120, for example, may be comprised of a single semiconductor substrate 132, or, alternatively, the semiconductor platform may comprise a mosaic of separate semiconductor substrates 132 (e.g., indicated as dashed lines 133), wherein the first electrically conductive layer 125 is further formed over the mosaic of semiconductor substrates. The mosaic of separate semiconductor substrates 132, for example, forms the semiconductor platform 120 by a piecing together of the separate semiconductor substrates to form a generally contiguous semiconductor platform. Such a mosaic, for example, is advantageous for electrostatic chucks requiring a diameter larger than a standard silicon wafer, wherein several semiconductor substrates can be pieced together to form the a larger semiconductor platform 120.

Figure 12:
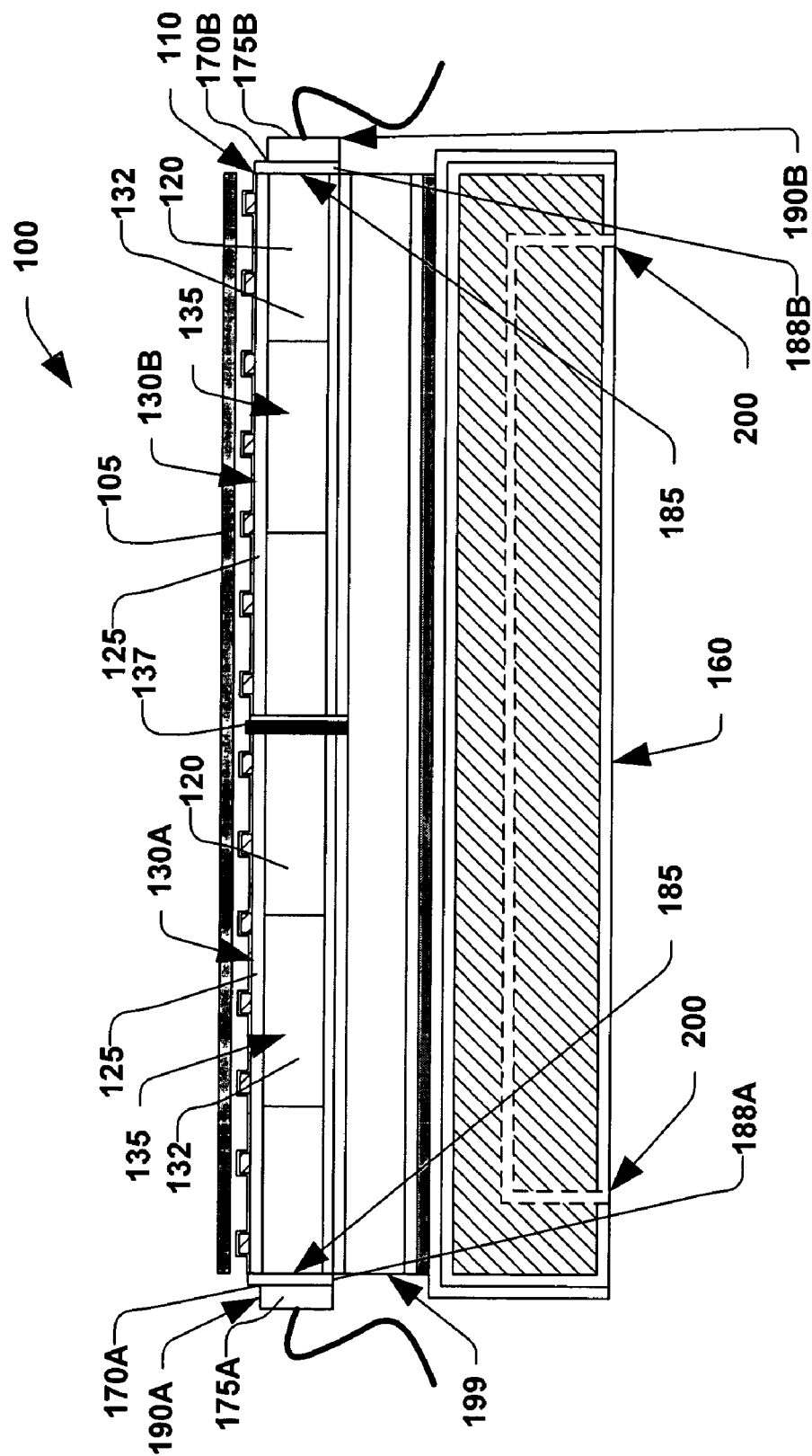
FIG. 12 is a partial cross-sectional view of an electrostatic chuck according to another exemplary aspect of the present invention.

In another alternative aspect of the present invention, as illustrated in FIG. 12, the semiconductor platform 120 may be comprised of a plurality of distinct segments 135 formed from separate semiconductor substrates 132, wherein the plurality of portions 130 of the first electrically conductive layer 125 are individually formed over each segment 135. The plurality of segments 135, for example, are separated from one another by an insulative material, such as a ceramic spacer 137, wherein the plurality of portions 130 of the first electrically conductive layer 125 are electrically isolated from one another.

Figure 3:
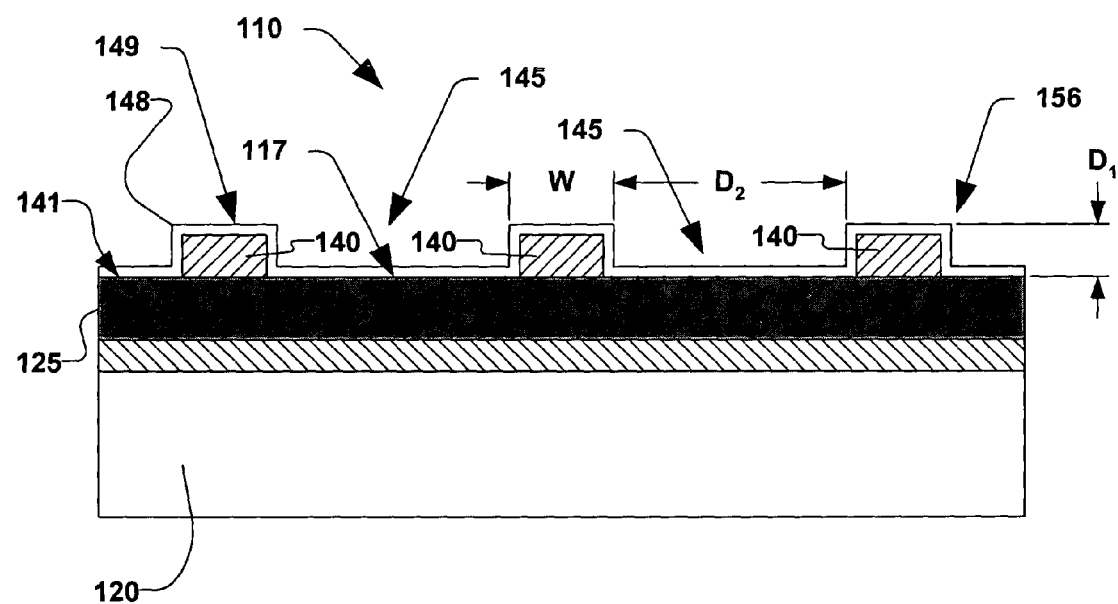
FIG. 3 is a partial cross-sectional view of an exemplary clamping plate having a plurality of protrusions according to an aspect of the present invention.

FIG. 3 illustrates a partial cross sectional view of a portion of the clamping plate 110 of FIG. 2, wherein several exemplary aspects of present invention are illustrated in greater detail. It should be noted that the figures are not necessarily drawn to scale, but rather are provided primarily for purposes of illustration. According to one exemplary aspect of the present invention, the clamping plate 110 further comprises a plurality of electrically insulative protrusions 140 generally extending outwardly from a top surface 141 of the first electrically conductive layer 125 of FIG. 2 (and hence, generally extending outwardly from the top surface 117 of the clamping plate 110). Referring again to FIG. 3, the plurality of protrusions 140 are generally formed over the first electrically conductive layer 125 and extend generally a first distance $D_1$ from the top surface 117 of the clamping plate 110. Accordingly, the plurality of protrusions 140 generally define a plurality of gaps 145 therebetween, wherein the plurality of protrusions, for example, are spaced from one another by a second distance $D_2$, thereby defining a width of the plurality of gaps. The second distance $D_2$ is generally less than a thickness of the substrate (not shown) to be clamped, whereby mechanical deflection of the substrate during clamping is significantly reduced, as will be discussed in greater detail hereafter. For example, the second distance $D_2$, is less than approximately 100 microns.

Figure 4:
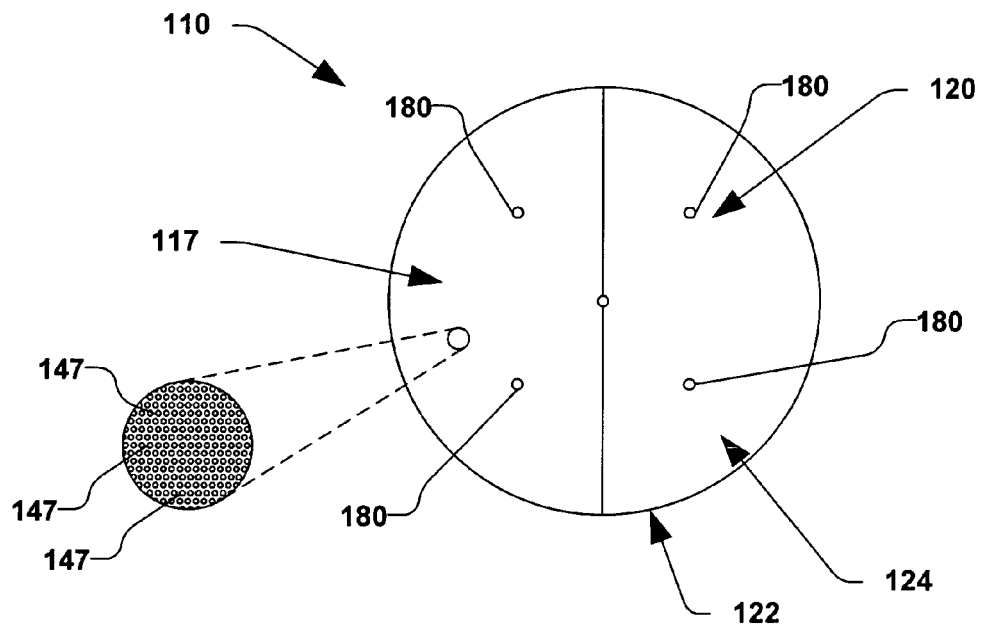
FIG. 4 is a plan view of an exemplary clamping plate comprising a plurality of protrusions according to an aspect of the present invention.

According to yet another exemplary aspect of the present invention, the plurality of protrusions 140 are comprised of microelectromechanical structures (MEMS). For example, the semiconductor platform 120 is comprised of a material which is typically utilized in forming MEMS microstructures, such as silicon, wherein the plurality of protrusions 140 are comprised of silicon dioxide ($SiO_2$) formed thereover. MEMS microstructures generally provide a tightly-controlled and consistent dimensional integrity across the top surface 117 of the clamping plate 110, wherein the plurality of protrusions 140 extend a generally consistent first distance $D_1$ from the top surface across the clamping plate. For example, FIG. 4 illustrates the plurality of protrusions 140 comprising a plurality of substantially cylindrical or rectangular islands 147 which have been formed over the top surface 117 of the clamping plate 110. The plurality of protrusions 140 are operable to generally contact the bottom surface 107 of the substrate 105, thereby defining a protrusion contact area. Preferably, the protrusion contact area (not shown) is less than about 5% of the total of the bottom surface area of the substrate 105 for gas conductivity. For example, the plurality of islands 147 of FIG. 3 may have a diameter of about 10 microns or less, wherein thermal conduction directly through the islands to the substrate 105 is substantially small.

Although the plurality of protrusions 140 extending from the top surface 117 of the clamping plate 110 are illustrated as being of uniform shape and arranged in an ordered manner, other arrangements of the plurality of protrusions are also contemplated, and any shape or order of protrusions or other such alternatives are contemplated as falling within the scope of the present invention. Referring again to FIG. 2, the top surface 127 of the semiconductor platform 120 and the plurality of protrusions 140 may furthermore comprise, for example, a protective coating 148, such as a silicon nitride ($Si_3N_4$) layer, formed thereover. The protective coating 148, as illustrated in FIG. 3, for example, can have a low emissivity, wherein heat emitted from the substrate (not shown) toward the clamping plate 115 is reflected from the protective coating during a heating of the substrate, thereby encouraging thermal conduction to occur primarily through gas conduction in the gaps, as will be discussed in greater detail infra. According to another example, the protective coating 148 provides a substantially hard and inert interface 149 between the clamping plate 110 and the substrate (not shown), wherein the protective coating generally decreases the possibility of contamination from a degradation of the clamping plate. According to yet another example, the protective coating 148 is operable to generally permit the substrate (not shown) to slide laterally over the interface 149 between the clamping plate 110 and the substrate, wherein the protective coating generally conforms to the plurality of the protrusions 140, thereby rounding one or more sharp edges 146A thereof.

Figure 5:
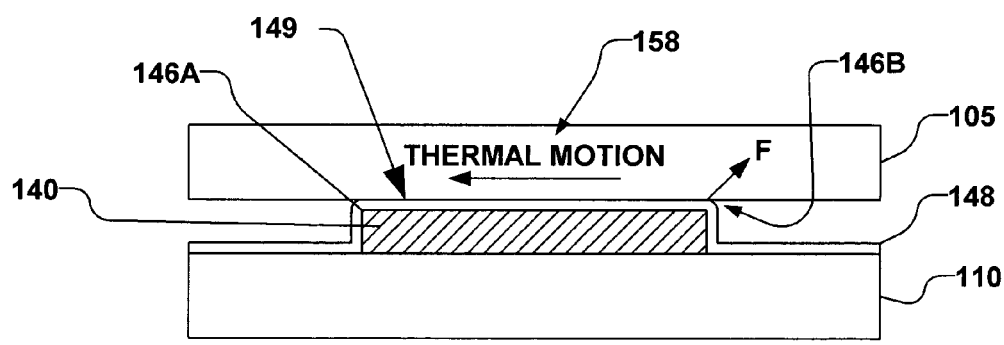
FIG. 5 is a partial cross-sectional view of an exemplary protrusion according to an aspect of the present invention.

FIG. 5 illustrates an exemplary protrusion 140, wherein the protective coating 148 has generally rounded the one or more sharp edges 146A, thereby defining one or more rounded edges 146B of the protrusion. As will be appreciated, due to lithography, such rounding may be even more pronounced than that illustrated. The one or more rounded edges 146B, for example, provide advantageous sliding characteristics during a thermal motion (e.g., a thermal expansion or contraction) of the substrate 105 with respect to the clamping plate 110. For example, the thermal motion 158 of the substrate 105 relative to the protrusion 140 can create a force F on the substrate 105 by the protrusion 140. The force F varies depending on, at least in part, the geometry of the protrusion 140. For example, sharp edges 156, as illustrated in FIG. 3, are more likely to create a large force F, wherein the substrate 105 is likely to laterally bind at the sharp edge of the protrusion 140. Stress fractures may appear in the substrate 105, for example, if the force F exceeds the yield strength of the substrate, thereby causing potential contamination and/or damage to the substrate. The rounded edges 146B of FIG. 5 on the other hand, generally limit the force F on the substrate 105 by spreading the force over the rounded edges. Limiting the force F on the substrate 105 generally permits the substrate to more freely expand or contract with respect to the clamping plate 110, thereby generally limiting lateral binding at the protrusion 140.

Figure 6:
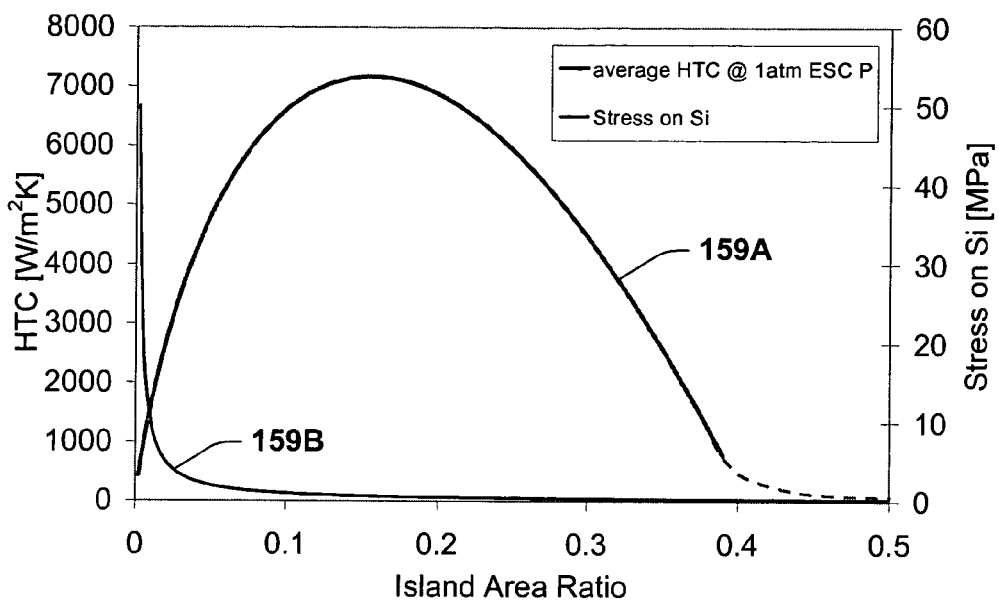
FIG. 6 is a graph illustrating contact heat transfer coefficient and stress on an exemplary clamping plate relative to area ratio according to an aspect of the present invention.

The above phenomena may be more fully appreciated in conjunction with FIG. 6, which illustrates a graph of the contact HTC and wafer stress for various contact area ratios. For example, at low area contact ratios (e.g., an AR of about 0.05 or less) the contact HTC (graph 159A) is small due to the small contact area between the protrusions and the wafer. While, in one instance, a low contact HTC is desirable (so that thermal conduction is dictated primarily by the thermal conduction of a gas residing between the clamping plate 110 and the substrate 105 of FIG. 2), such small area ratios typically cause the stress (graph 159B of FIG. 6) on the substrate to be undesirably high. In another instance, mechanical pressure between the substrate 105 of FIG. 2 and the plurality of protrusions 140 determines, at least in part, the thermal contact HTC between the substrate and the clamping plate 110, wherein the thermal contact HTC generally decreases at low mechanical pressures.

Referring again to FIG. 6, as the area contact ratio increases (e.g., protrusion contact area of all the protrusions being a larger proportion of the entire wafer area), the contact HTC begins to increase, reach a maximum and decrease again, which reflects the trade-offs that occur due to increased area and reduced contact pressure per unit area on the protrusions. In this range (e.g., between an AR of about 0.1 to about 0.3) the contact HTC is relatively high, thereby making switching of a cooling of the ESC via a pressure control of the gas residing between the ESC and the substrate more difficult or less controlled, while the contact HTC is generally more controllable by contact pressure between the substrate and the protrusions. At higher contact area ratios, for example, ARs of about 0.4 or more, the stress is negligible and the contact HTC is again substantially low such that the activation/deactivation of cooling is dictated primarily by a cooling gas backside pressure.

Referring again to FIG. 3, according to another exemplary aspect of the present invention, the plurality of protrusions 140 are operable to generally maintain the first distance $D_1$ from the top surface 117 of the clamping plate to the bottom surface 107 of the substrate 105 of FIG. 2, and are further operable to generally permit a flow of a cooling gas (not shown) within the plurality of gaps 145, wherein the electrostatic chuck 100 is operable to transfer heat from the substrate to the clamping plate via thermal conduction in the free molecular regime of the cooling gas. For example, in order to permit thermal conduction in the free molecular regime, the first distance $D_1$ is generally under 5 microns. Preferably, the first distance $D_1$ from the top surface 117 of the clamping plate 110 to the bottom surface 107 the substrate 105 is approximately 1 micron or less.

Generally, the behavior of a cooling gas heat transfer coefficient (HTC) across a distance between two bodies falls into one of three operating regimes: the viscous regime, the free molecular regime, and the transition regime. In the viscous regime, the heat transfer coefficient (HTC) is a function of the gap distance and the thermal conductivity of the cooling gas, but generally is independent of the cooling gas pressure (hereinafter referred to as backside gas pressure). In the free molecular regime, the HTC is a function of the backside gas pressure and the molecular weight of the cooling gas, but is independent of the gap distance. The free molecular regime is established substantially with the distance (e.g., the first distance $D_1$) less than a few microns (e.g., about 3–5 microns). Furthermore, the transition regime is characterized by a smooth interpolation between the viscous regime and the molecular regime.

Conduction of heat through a gas in the free molecular regime, as defined by the present invention, provides for several unique advantages. For example, by maintaining the gap (e.g., the distance $D_1$) on the order of the mean free path of the cooling gas, cooling across the wafer is substantially insensitive to the gap distance and instead is primarily a function of the backside pressure, thereby leading to cooling uniformity spatially across the wafer, despite slight variations in the gap (e.g., due to wafer deformation or particulates). In addition, since the gap distance is small, the volume associated therewith is also small, thereby allowing a cooling of the wafer to be effectuated extremely quickly by altering the backside pressure. Thus the present invention allows one to quickly cool the wafer once a spike anneal temperature is reached.

Figure 7:
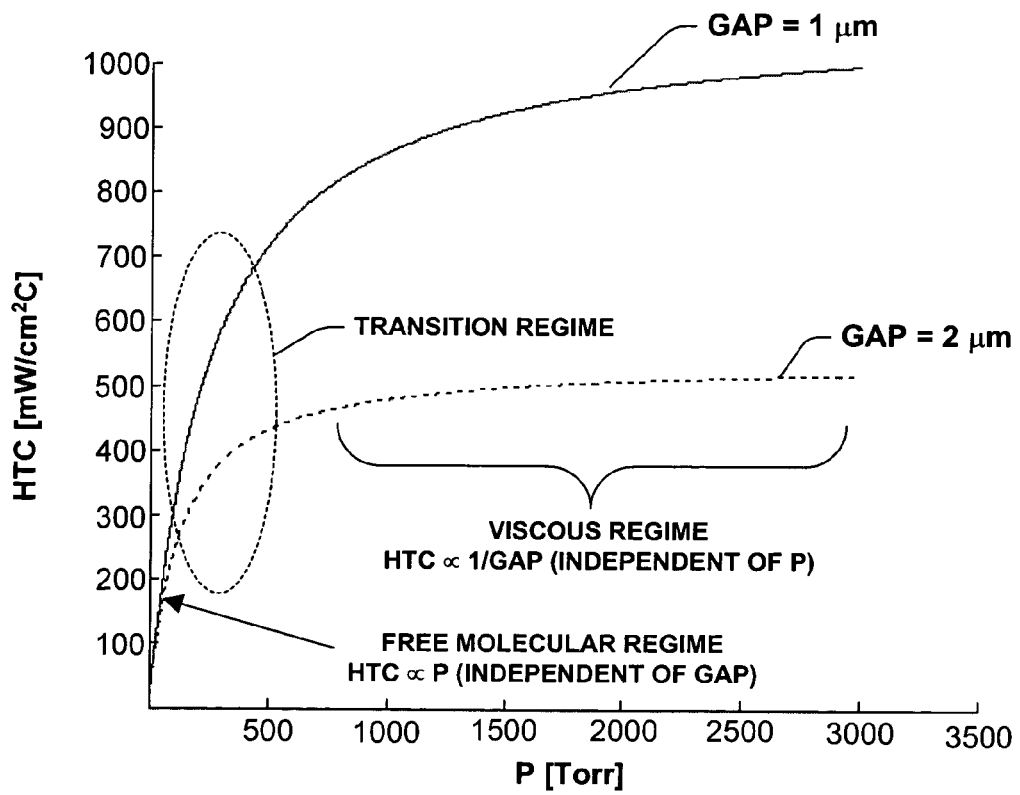
FIG. 7 is a graph illustrating an exemplary heat transfer coefficient of a gas in the molecular and viscous regimes according to an aspect of the present invention.

FIG. 7 is a graph that illustrates the behavior of the HTC versus backside gas pressure for nitrogen at first distances $D_1$ of 1 and 2 microns. The free molecular regime, in which the HTC is predominantly a function of backside gas pressure, is seen for gas pressures in the present example in the range of 0 to about 250 Torr when the first distance $D_1$ is 1 micron, or when the first distance $D_1$ is less than the mean free path (MFP) of the cooling gas. The viscous regime, in which the HTC is a primarily a function of the first distance $D_1$, is seen for backside gas pressures greater than approximately 250 Torr, or when the first distance $D_1$ is greater than the mean free path (MFP) of the cooling gas (not illustrated in the present figure). Between these two regimes, the transition regime is seen.

FIG. 7 further illustrates that in the free molecular regime the cooling gas HTC may be controlled primarily by adjusting the backside gas pressure, however, the first distance $D_1$ still plays a role in the HTC at higher pressures. For example, for a first distance $D_1$ of 2 microns as compared to 1 micron, the thermal conductivity of the cooling gas begins transitioning from the free molecular regime to the viscous regime at approximately 250–275 Torr. Therefore, first distance $D_1$ uniformity is still a concern when varying pressures from atmospheric pressure to substantial vacuum pressures (e.g., less than 20 Torr). However, by controlling the pressure between substantial vacuum and about 250 Torr the HTC can be controlled primarily by the backside pressure independent of slight variations in the gap distance. Therefore cooling uniformity across the wafer is maintained.

Figure 8:
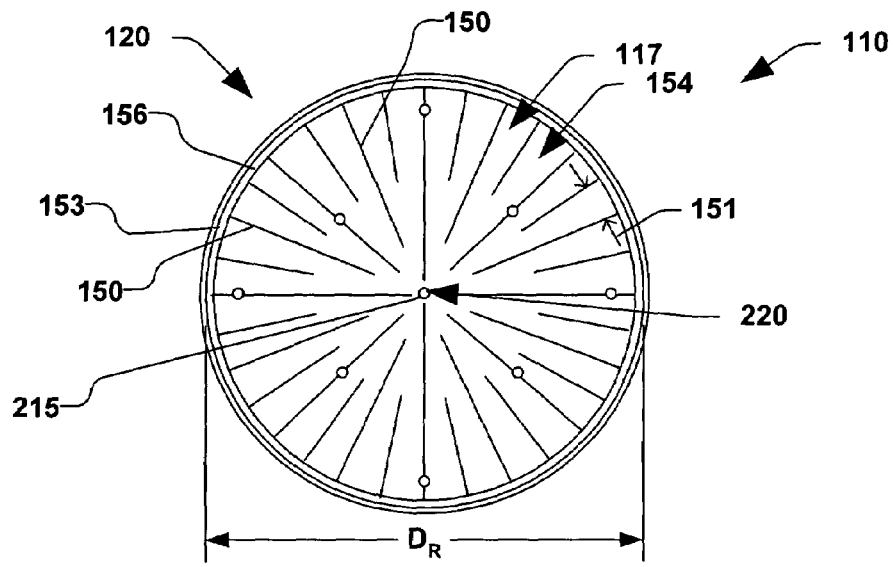
FIG. 8 is a plan view of an exemplary clamping plate comprising a plurality of gas distribution grooves according to one aspect of the present invention.
Figure 9:
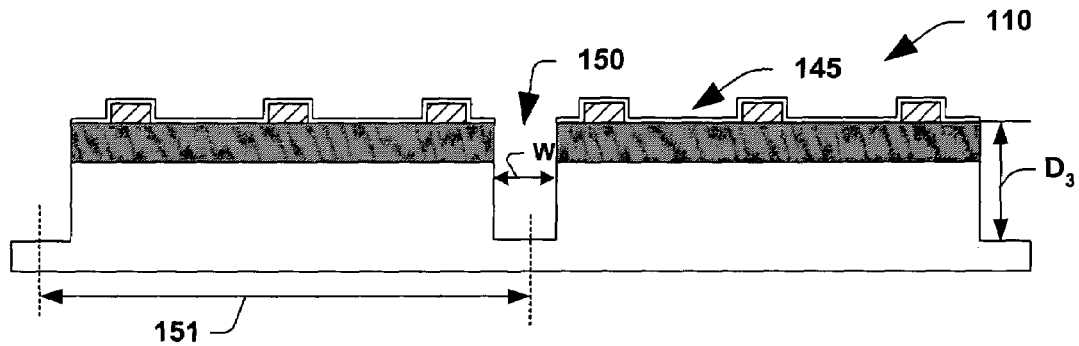
FIG. 9 is a partial cross-sectional view of an exemplary clamping plate illustrating gas distribution grooves.

According to yet another exemplary aspect of the present invention, as illustrated in FIG. 8, the clamping plate 110 comprises one or more gas distribution grooves 150, wherein the gas distribution grooves are adapted to allow the cooling gas (not shown) to flow therethrough, and wherein an adjustment to the pressure of the cooling gas (the backside pressure) can be quickly attained. As illustrated in FIG. 9, the gas distribution grooves 150 generally extend a third distance $D_3$ into the clamping plate 110, wherein each gas distribution groove intersects at least one of the plurality of gaps 145 of FIG. 2 associated with the clamping plate. The third distance $D_3$, for example, is less than approximately 100 microns, wherein the flow of the cooling gas within the gas distribution grooves 150 falls into the viscous regime. Furthermore, a significantly larger third distance $D_3$ of the gas distribution groove (compared to the gap 145) generally permits a fast response time for pumping the cooling gas from the clamping plate 110.

The gas distribution groove 150 is further characterized by a width W generally coplanar with the top surface 117 of the clamping plate 110. The width W of the gas distribution groove 150 is preferably less than 100 microns, or the thickness (not shown) of the substrate 105 residing on the clamping plate 110, such that thermal conduction is substantially uniform across the bottom surface 107 of the substrate, for reasons similar to those discussed above. According to another exemplary aspect, the width of each gas distribution groove 150 is approximately equal to the third distance $D_3$.

By having gas distribution grooves 150 that are substantially large (e.g., compared to the gaps 145 between the protrusions 140), gas flow therethrough is in the viscous regime that is about 50 times greater than the flow rate in the free molecular regime for a given pressure. The fast flow rate of cooling gas through the gas distribution grooves 150 facilitates a fast turn-on for cooling of the substrate. Nevertheless, the total surface area of the grooves is very small compared to a contact area of the gas to the wafer in the plurality of gaps 145. In this respect, FIG. 9 is not drawn to scale (but is instead provided for purposes of illustration), rather the number of gaps 145 between the grooves 150 is quite substantial. For example, for a groove distance 151 of less than about 1 cm, and the protrusions 140 having a diameter of about 10 microns or less, approximately 90 protrusions or more may reside between the grooves.

Figure 10:
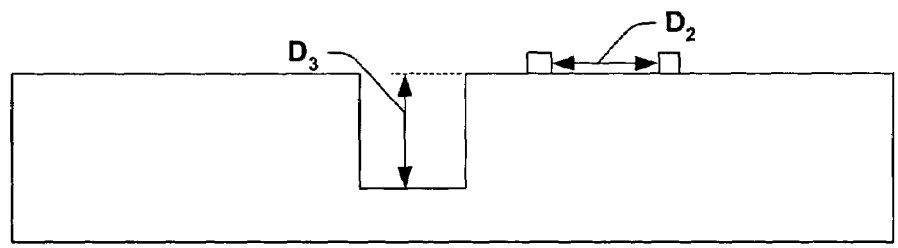
FIG. 10 is a simplified partial cross-section view of an exemplary clamping plate illustrating an exemplary relationship between groove depth and protrusion distance according to one aspect of the present invention.

Accordingly, the plurality of gas distribution grooves 150 are provided, wherein the plurality of gas distribution grooves are operable to significantly decrease a response time for pumping the cooling gas from the clamping plate 110. For example, as illustrated in FIG. 8, the plurality of gas distribution grooves 150 may radiate generally outwardly from a center 152 of the clamping plate 110, wherein the plurality of gas distribution grooves are patterned such that any location on the top surface 117 of the clamping plate is within about 5 mm from at least one of the plurality of gas distribution grooves. Preferably, the distance 151 between the grooves is less than about 1 cm. Although the plurality of gas distribution grooves 150 are illustrated as radially extending grooves, it should be understood that the grooves may be configured in numerous ways, and in varying numbers, and such variations are contemplated as falling within the scope of the present invention. Further, as illustrated in the example of FIG. 10, a depth $D_3$ of the grooves 150 is approximately the same as a distance $D_2$ between the various protrusions 140.

The cooling gas, for example, comprises one or more of substantially thermally conductive gases, such as oxygen, hydrogen, helium, argon, and nitrogen, wherein the cooling gas is generally supplied to an environment (not shown) such as a process chamber (not shown) containing the electrostatic chuck 100 of FIG. 2. Therefore, the cooling gas is pumped from the environment (e.g., from within the process chamber (not shown)) through the electrostatic chuck 100, and out to an appropriate pump (not shown). According to another exemplary aspect of the invention, referring again to FIG. 8, one of the plurality of protrusions comprises a ring 153 which is generally coaxial with the substrate 105. The diameter $D_R$ of the ring 153, for example, is slightly smaller than the diameter D of the substrate 105 illustrated in FIG. 2, wherein the ring is operable to generally enclose an inner portion 154 of the substrate and the clamping plate 115, generally forming a seal between the inner portion and the environment 155. Referring again to FIG. 8, according to another example, a peripheral gas distribution groove 156 resides within the ring 153, wherein the peripheral gas distribution groove generally connects the plurality of distribution grooves 150.

According to another exemplary aspect of the invention, the exemplary electrostatic chuck 100, as illustrated in FIG. 2, further comprises a base plate 160 operable to transfer thermal energy from the substrate 105 and the clamping plate 110. The base plate 160, for example, is generally characterized by a top surface 162 associated with the bottom surface 117 of the clamping plate 110. The top surface 162 of the base plate 160, for example, generally faces the bottom surface 117 of the clamping plate 110, wherein the base plate and the clamping plate are thermally coupled to one another. The base plate 160, for example, is comprised of a material that provides good thermal conductivity, such as a metal. Exemplary base plate 160 metals are aluminum, copper, or other metal alloys with good thermal conductivity. Alternatively, the base plate 160, for example, is comprised of a material having a thermal conductivity similar to a thermal conductivity of the clamping plate 110, such as amorphous silicon (a-Si) or silicon carbide (SiC).

According to another exemplary aspect of the present invention, the clamping plate 110 further comprises a second electrically conductive layer 165, wherein the second electrically conductive layer further comprises a plurality of portions 167 electrically isolated from one another. The plurality of portions 167 of the second electrically conductive layer 165 electrically connect to the respective plurality of portions 130 of the first electrically conductive layer 125. The plurality of portions 167 of the second electrically conductive layer 165, for example, generally reside between a bottom surface 168 of the semiconductor platform 120 and the top surface 162 of the base plate 160. According to one example, the plurality of portions 167 of the second electrically conductive layer 165 are formed over the bottom surface 168 of the semiconductor platform 120 during the formation of the first conductive layer 125 over the top surface 127 of semiconductor platform 120.

Figure 11:
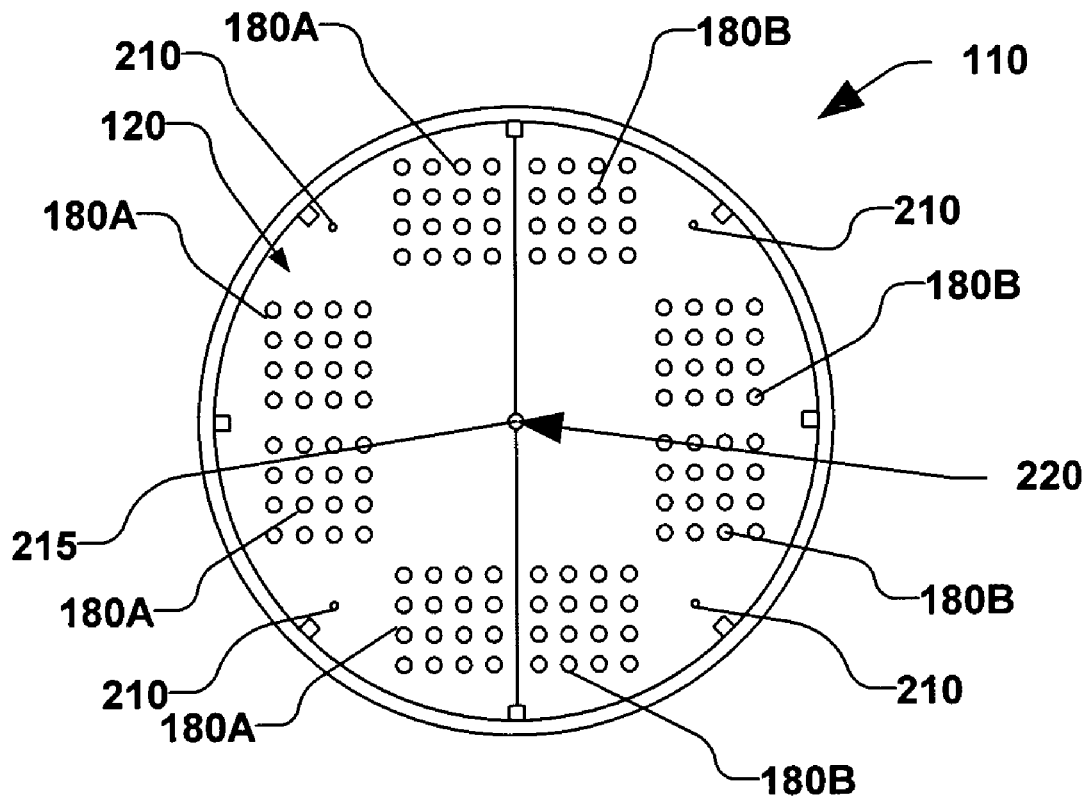
FIG. 11 is a plan view of an exemplary clamping plate comprising a plurality of vias according to the one aspect of the present invention.

According to still another exemplary aspect of the present invention, the second electrically conductive layer 165 further comprises a plurality of electrically conductive vertical interconnects 170. The vertical interconnects 170, for example, electrically connect the first electrically conductive layer 125 and the second electrically conductive layer 165. A plurality of electrodes 175, for example, are further electrically connected to the second electrically conductive layer 165, therein electrically connecting the first electrically conductive layer 125 to the plurality of electrodes via the plurality of vertical interconnects 170. The plurality of vertical interconnects 170 may comprise, for example, a plurality of vias 180 associated with the semiconductor platform 120, wherein the plurality of vias generally extend from the top surface 127 to the bottom surface 168 of the semiconductor platform. The plurality of vias 180, therefore, electrically connect each portion 130 of the first electrically conductive layer 125 to the respective portion 167 of the second electrically conductive layer 165. Each portion 130 and 167 of the first electrically conductive layer 125 and second electrically conductive layer 165, respectively, may be electrically connected, for example, by one or more of the plurality of vias 180 (e.g., portion 130A is electrically connected to portion 167A through one or more vias 180A). As Illustrated in FIG. 11, for example, the plurality of vias 180 are generally oriented about the semiconductor platform 120 such that the clamping plate 110 is substantially thermally and electrically balanced.

According to another example, FIG. 12 illustrates another exemplary ESC 100, wherein the plurality of vertical interconnects 170 are associated with a sidewall 185 of the semiconductor platform 120, therein defining a plurality of sidewall interconnects 188. Each portion 130 of the first electrically conductive layer 125, for example, is electrically connected to a respective sidewall interconnect 188, wherein each sidewall interconnect may be electrically connected to the respective electrode 175. For example, each respective electrode 175 comprises a spring-forced sidewall contact electrode 190, wherein the spring-forced sidewall contact electrodes are mechanically compressed against the respective sidewall interconnects 188 by a spring force (not shown), wherein physical bonding (e.g., brazing or epoxy bonding) of the electrodes to the sidewall interconnects is not necessary.

Figure 13:
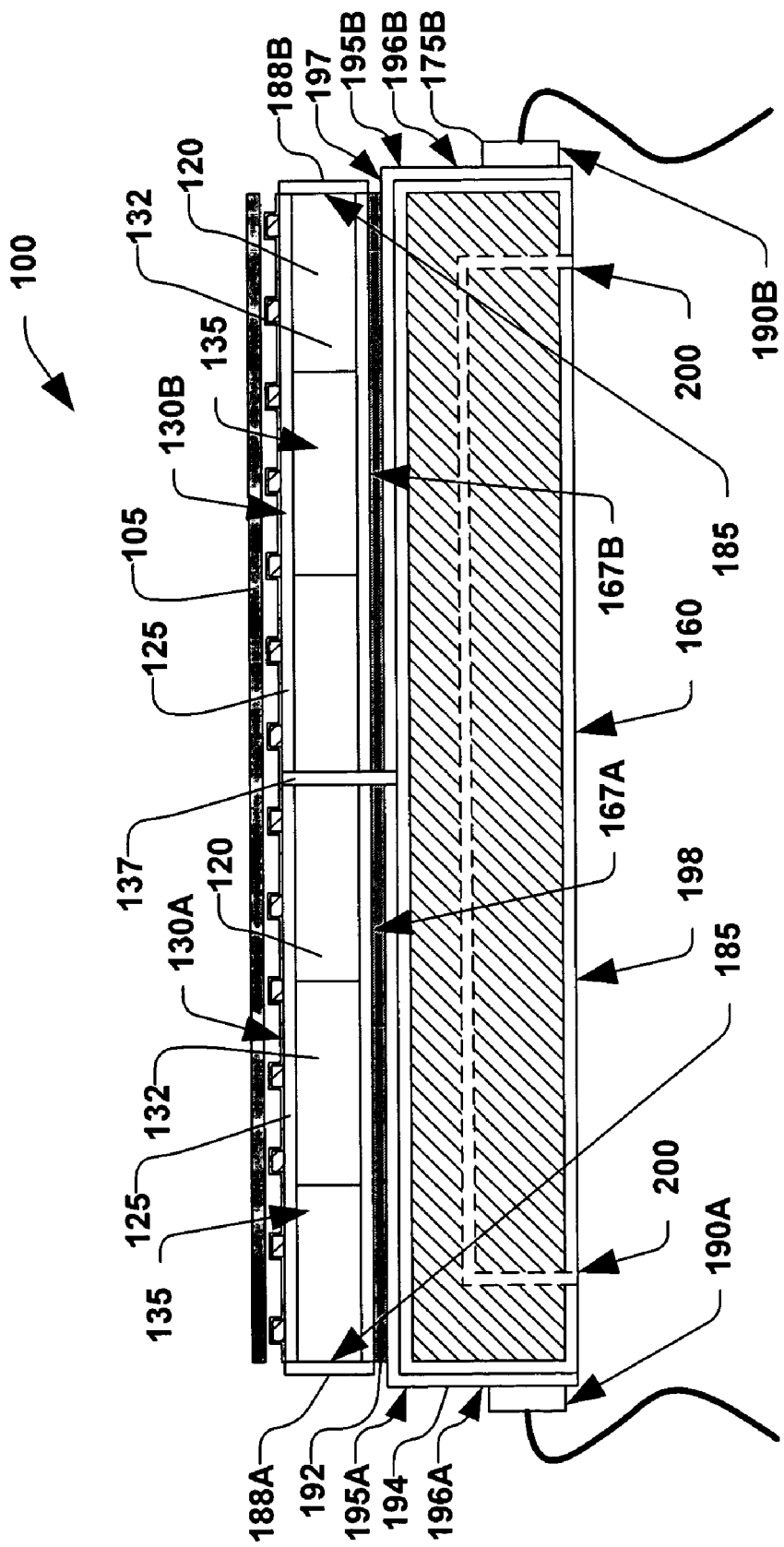
FIG. 13 is a partial cross-sectional view of an electrostatic chuck according to still another exemplary aspect of the present invention.

According to another exemplary aspect of the present invention, as illustrated in FIG. 13, the base plate 160 comprises a first electrically insulative layer 192 and a third electrically conductive layer 194 is formed thereover. The first electrically insulative layer 192 (e.g., an oxide) generally resides between the base plate 160 and the third electrically conductive layer 194. The third electrically conductive layer 194, for example, further comprises a plurality of portions 195 associated with the respective plurality of portions 130 and 167 of the first electrically conductive layer 125 and the second electrically conductive layer 165, respectively, wherein each portion 195 of the third electrically conductive layer 194 is electrically connected to the respective portion 167 of the second electrically conductive layer. The plurality of portions 195 of the third electrically conductive layer 194 are further electrically isolated from one another, therein keeping the poles of the ESC 100 electrically isolated. For example, the third electrically conductive layer 194 generally resides along a sidewall 196 and a top surface 197 of the base plate 160 (e.g., over the first insulative layer 192), wherein the plurality of electrodes 175 are electrically connected to the third electrically conductive layer at the sidewall of the base plate. Alternatively, the third electrically conductive layer 194 may further be formed over a bottom surface 198 of the base plate 160, wherein the plurality of electrodes 175 may be electrically connected to the third electrically conductive layer at the bottom surface of the base plate (not shown).

The third electrically conductive layer 194, for example, generally permits a bonding of the base plate 160 to the clamping plate 110, wherein the base plate can be thermally coupled to the clamping plate, and can be electrically connected to the second electrically conductive layer 165. One exemplary method of coupling the base plate 160 to the bottom surface 117 of the clamping plate 110 is accomplished by brazing, wherein the bottom surface 117 of the clamping plate is metallized (e.g., by the second electrically conductive layer 165) and then vacuum brazed to the top surface 162 of the base plate. For example, the third electrically conductive layer 194 is formed over the top surface 162 of the base plate 160, wherein the second and third electrically conductive layers 165 and 194 are vacuum brazed together. The second and third electrically conductive layers 165 and 194, for example, are comprised of one or more of tungsten silicide, tungsten, or titanium, however any electrically conductive material is contemplated as falling within the scope of the present invention.

According to another exemplary aspect of the invention, referring again to FIG. 12, an electrically insulative intermediate plate 199 resides between the base plate 160 and the clamping plate 110. The intermediate plate 199, for example, comprises an aluminum nitride insulator wafer, wherein the intermediate plate generally electrically insulates the clamping plate 110 from the base plate 160, and still provides adequate thermal conductance. Furthermore, the intermediate plate 199 may be vacuum-brazed to the base plate 160 and the clamping plate 110.

Figure 16A:
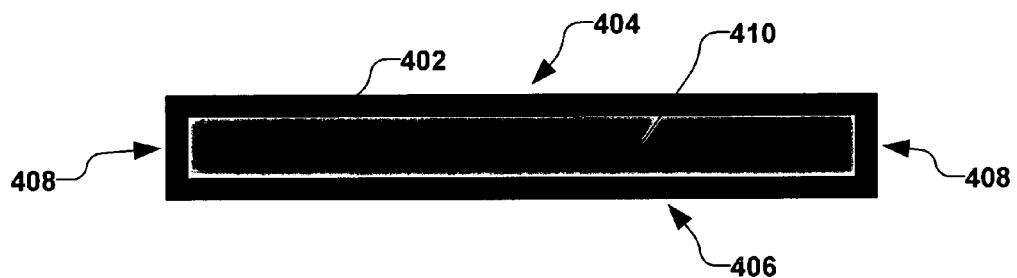
FIGS. 16A–16U illustrate partial cross-sectional views of a simplified electrostatic chuck as formed by the method of FIG. 15 according to the present invention.
Figure 16B:
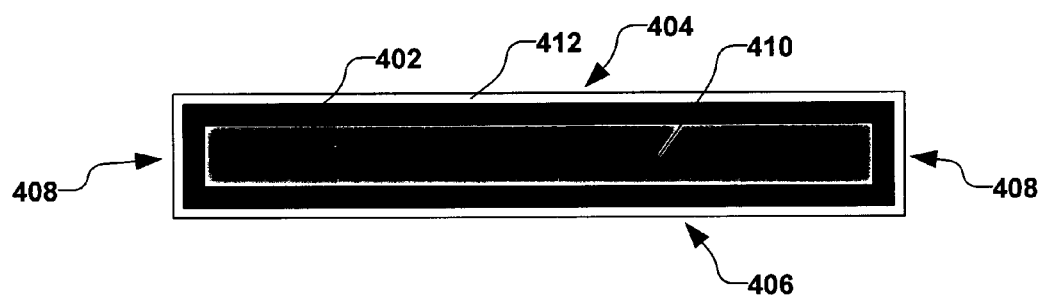
Figure 16C:
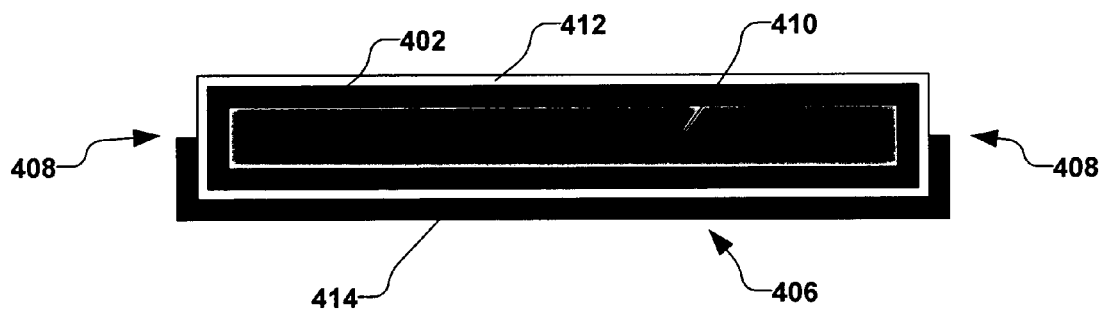
Figure 16D:
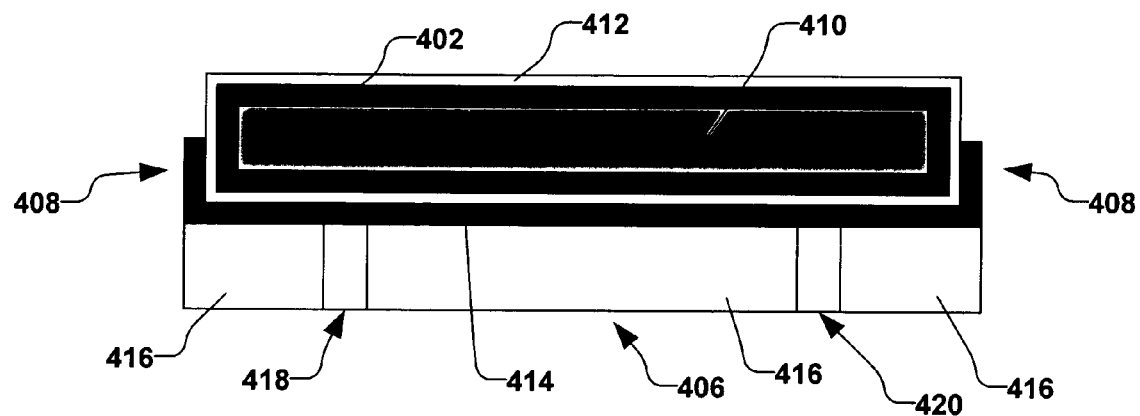
Figure 16E:
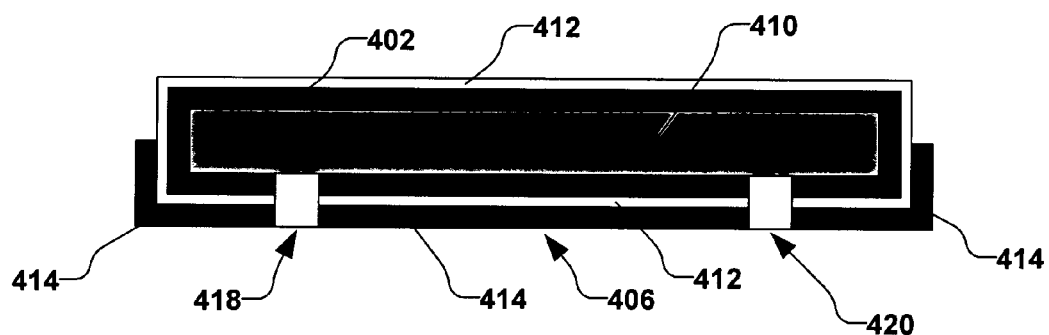
Figure 16F:
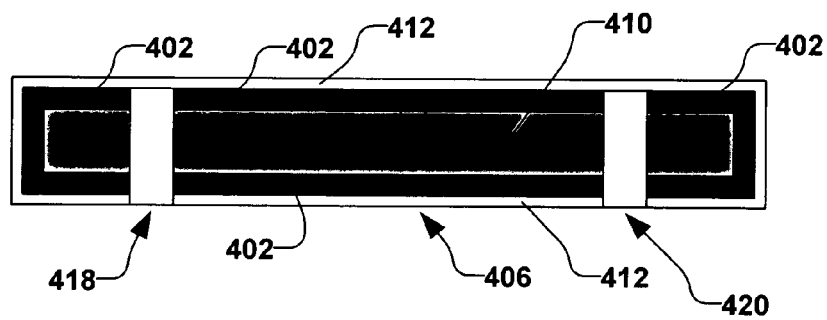
Figure 16G:
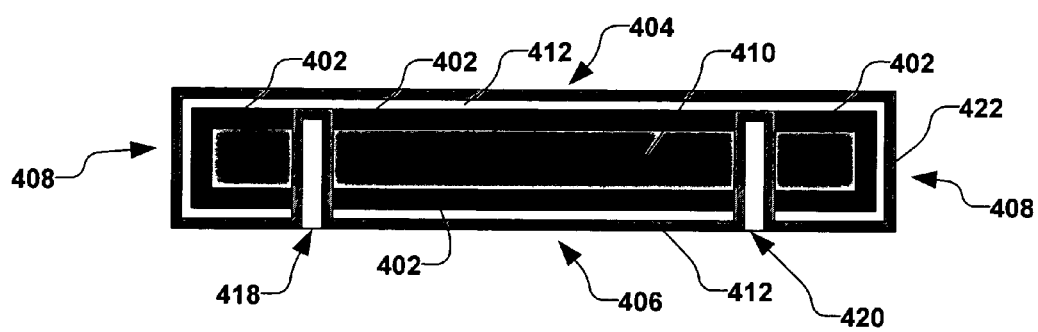
Figure 16H:
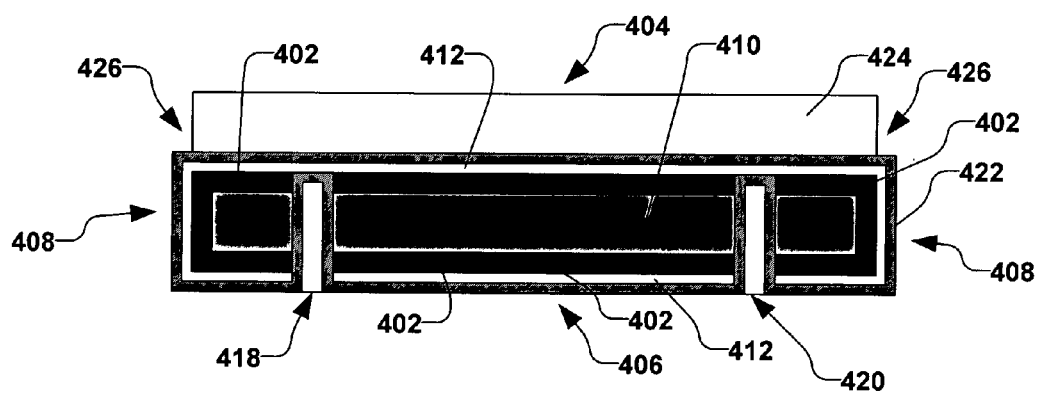
Figure 16I:
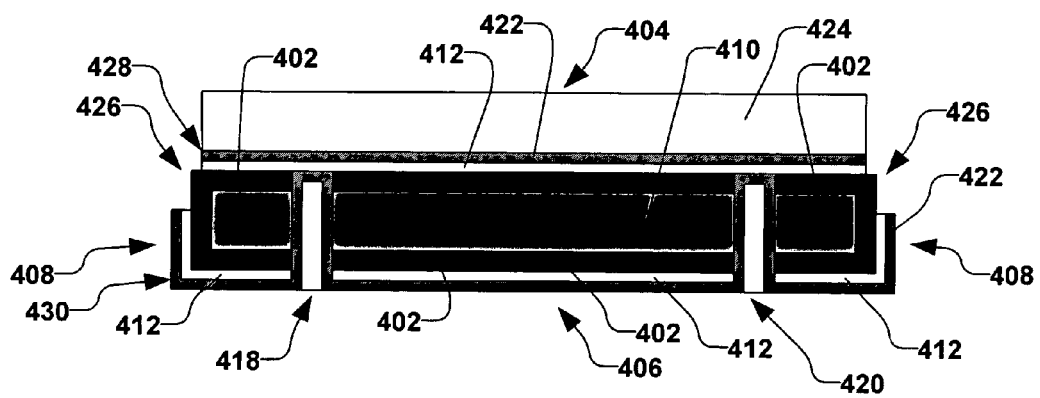
Figure 16J:
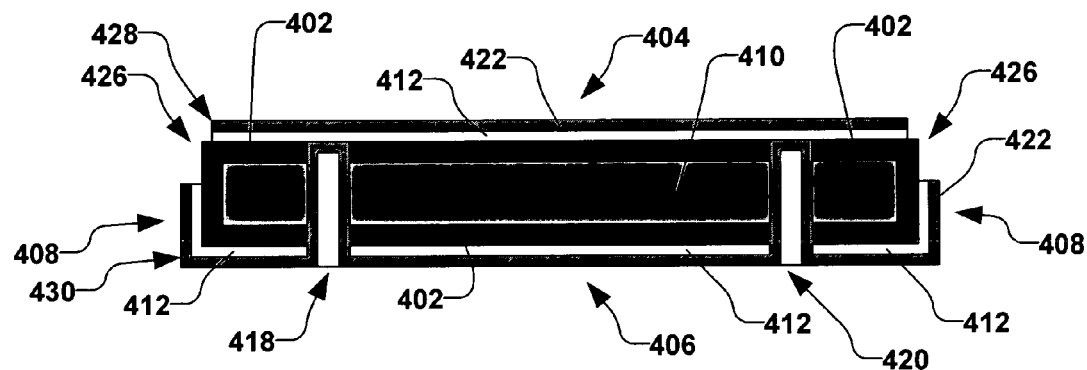
Figure 16K:
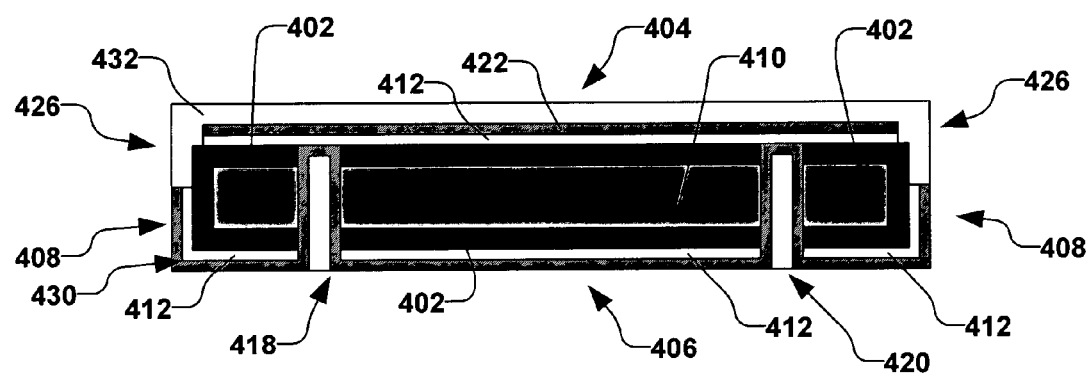
Figure 16L:
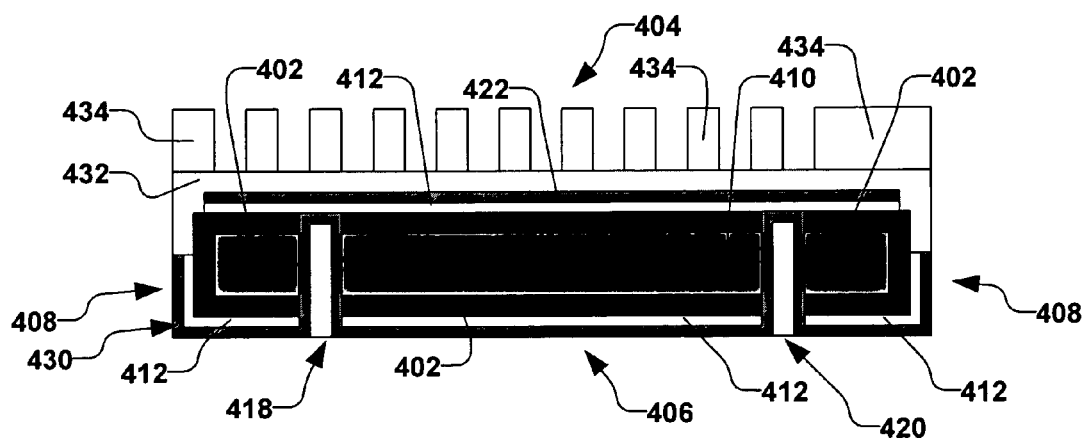
Figure 16M:
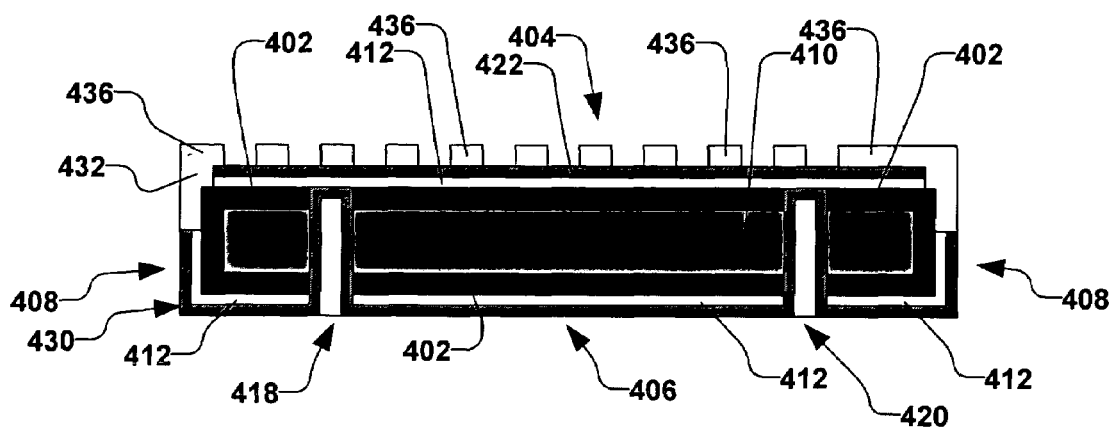
Figure 16N:
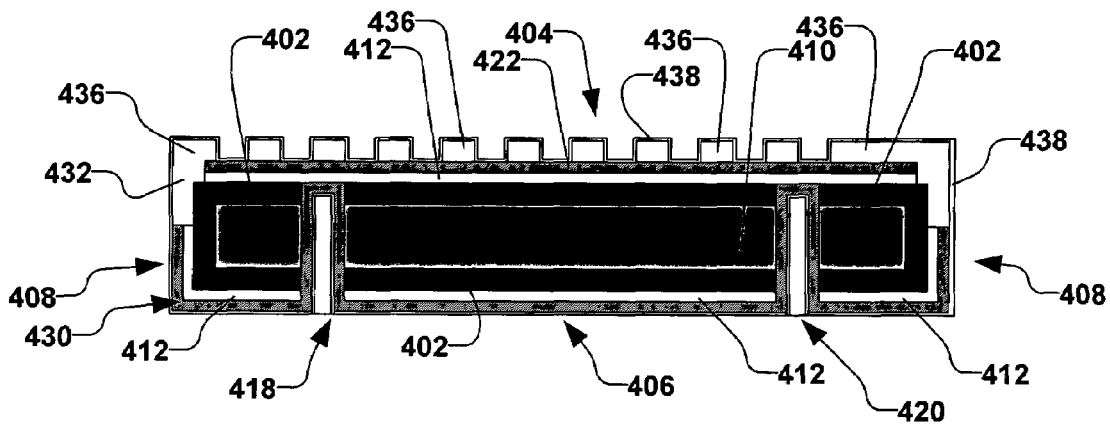
Figure 16O:
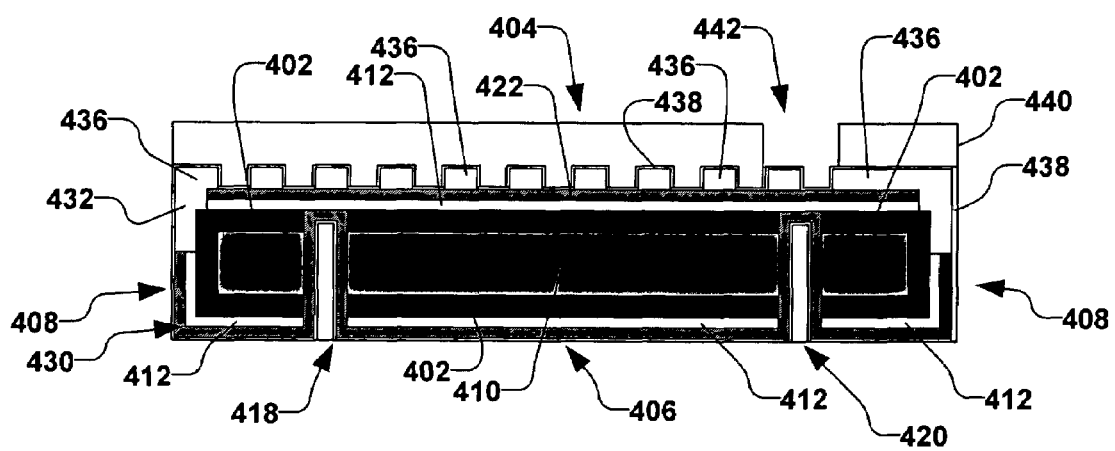
Figure 16P:
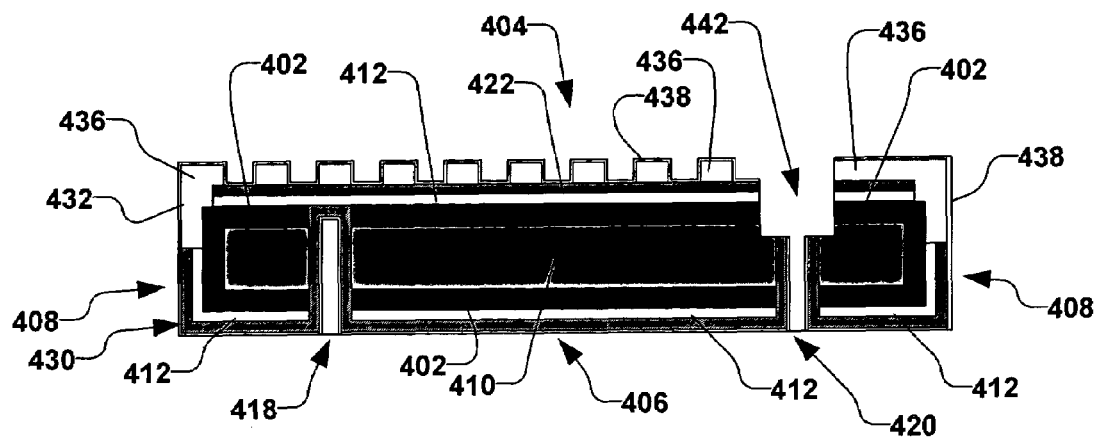
Figure 16Q:
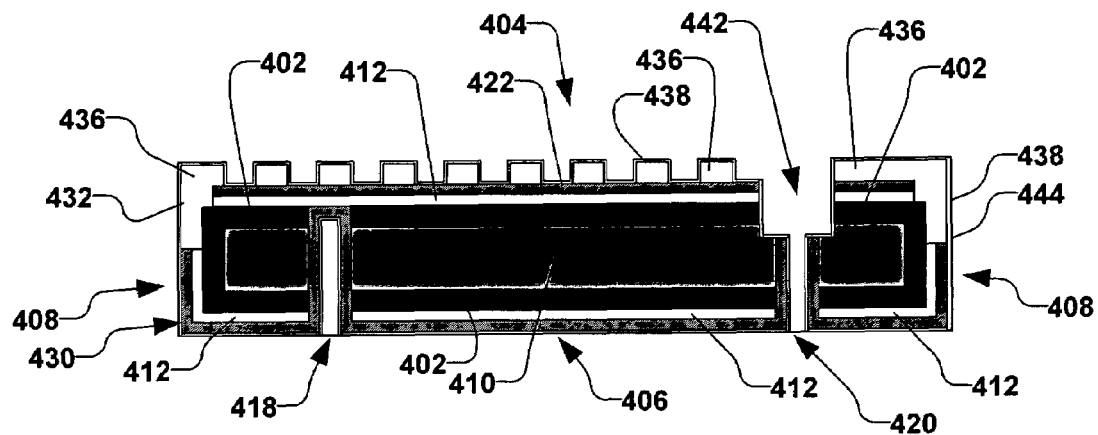
Figure 16R:
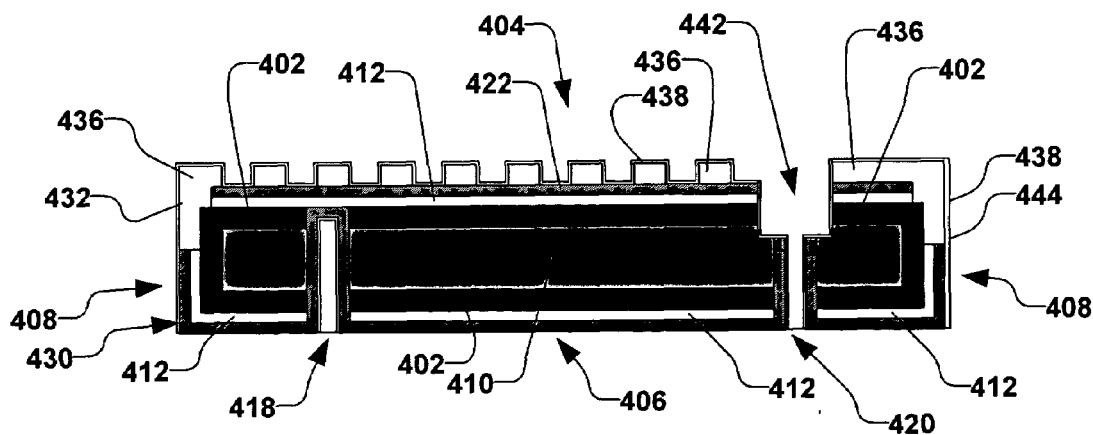
Figure 16S:
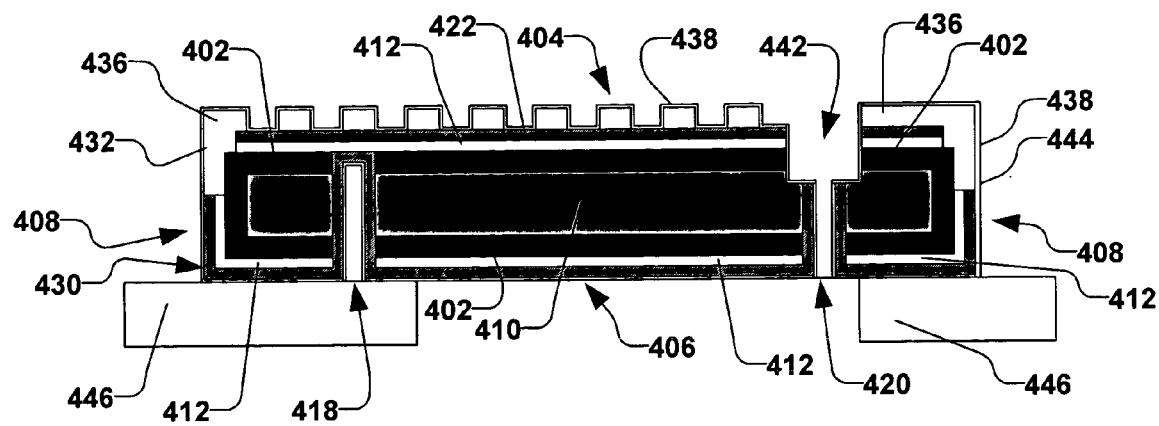
Figure 16T:
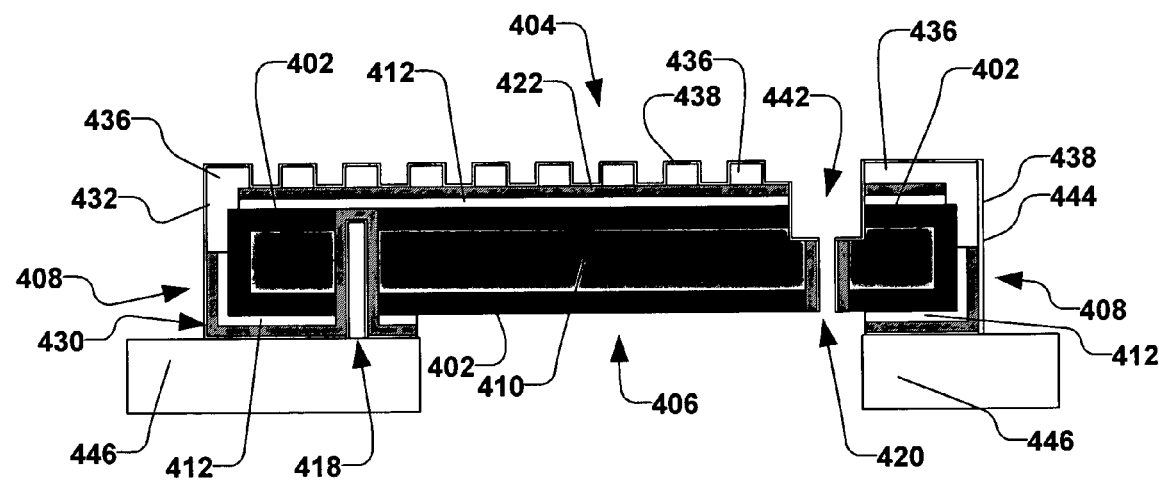
Figure 16U:
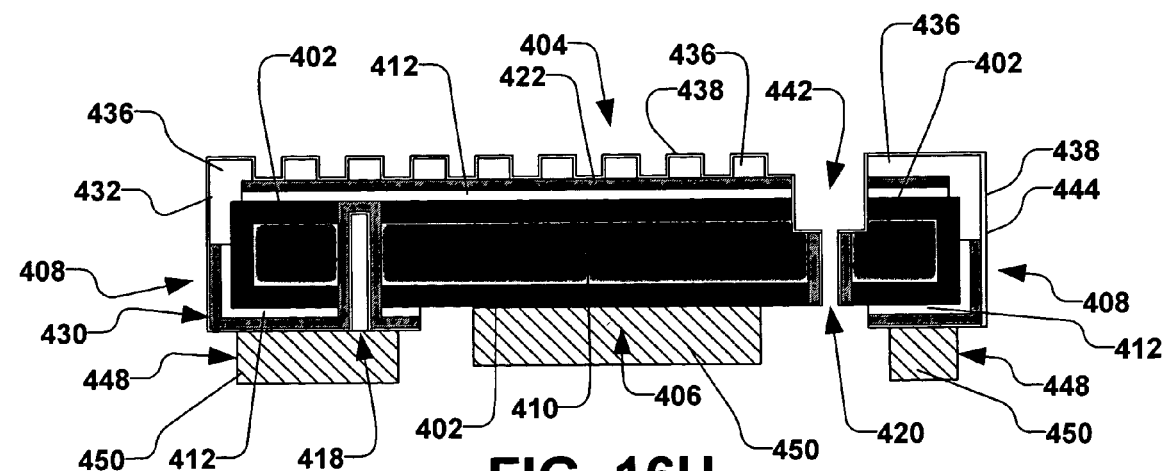

Referring again to FIG. 2, the base plate 160, for example, further comprises one or more first fluid conduits 200, wherein the one or more first fluid conduits are operable to generally permit a cooling fluid (not shown), such as water, to flow therethough, wherein the base plate is substantially cooled by the cooling fluid. As illustrated in FIG. 16U, the base plate 450 may be electrically conductive and further comprise a plurality of poles 448, wherein the plurality of poles are electrically connected to the respective plurality of portions of the second electrically conductive layer 430, as will be discussed hereafter.

Referring again to FIG. 11, according to another exemplary aspect of the invention, a plurality of lift pins 210 are operatively coupled to the clamping plate 110, wherein the plurality of lift pins 210 are operable to vertically translate the substrate 105 of FIG. 2 between a processing position (not shown) proximate to the clamping plate 110 and a loading position (not shown) generally above the clamping plate (e.g., approximately 1–2 mm above the clamping plate). The lift pins 210 of FIG. 11, for example, are comprised of quartz, silicon carbide, or a ceramic material, wherein contamination of the substrate 105 from the lift pins during processing is minimized. Furthermore, the lift pins 210 have a generally small diameter (e.g., 1 or 2 mm) that will significantly limit a volume occupied by the lift pins within the electrostatic chuck 100 of FIG. 2 when the pins are in the processing position. Minimizing the volume occupied by the lift pins 210 while in the processing position is advantageous, wherein the backside pressure can be quickly modified.

According to still another exemplary aspect of the present invention, the electrostatic chuck 100 further comprises a temperature sensor 215 operable to measure one or more temperatures T associated with the substrate 105 of FIG. 2. For example, the temperature sensor 215 of FIG. 8 comprises a pyrometer, wherein the pyrometer measures the temperature T of the substrate (not shown) through an opening 220 in the top surface 117 of the clamping plate 110. The temperature sensor 215 may comprise, for example, a pyrometer having a minimal volume cavity, wherein the opening 220 through which the pyrometer measures the temperature T of the substrate 105 is small. Minimizing the volume of the opening is advantageous, wherein the backside pressure can be quickly modified. Alternatively, the temperature sensor 215 may comprise an optical pyrometer that may furthermore utilize fiber optic rods (not shown) inserted into the clamping plate 110 such that the fiber optic rod occupies the minimal volume cavity.

Figure 14:
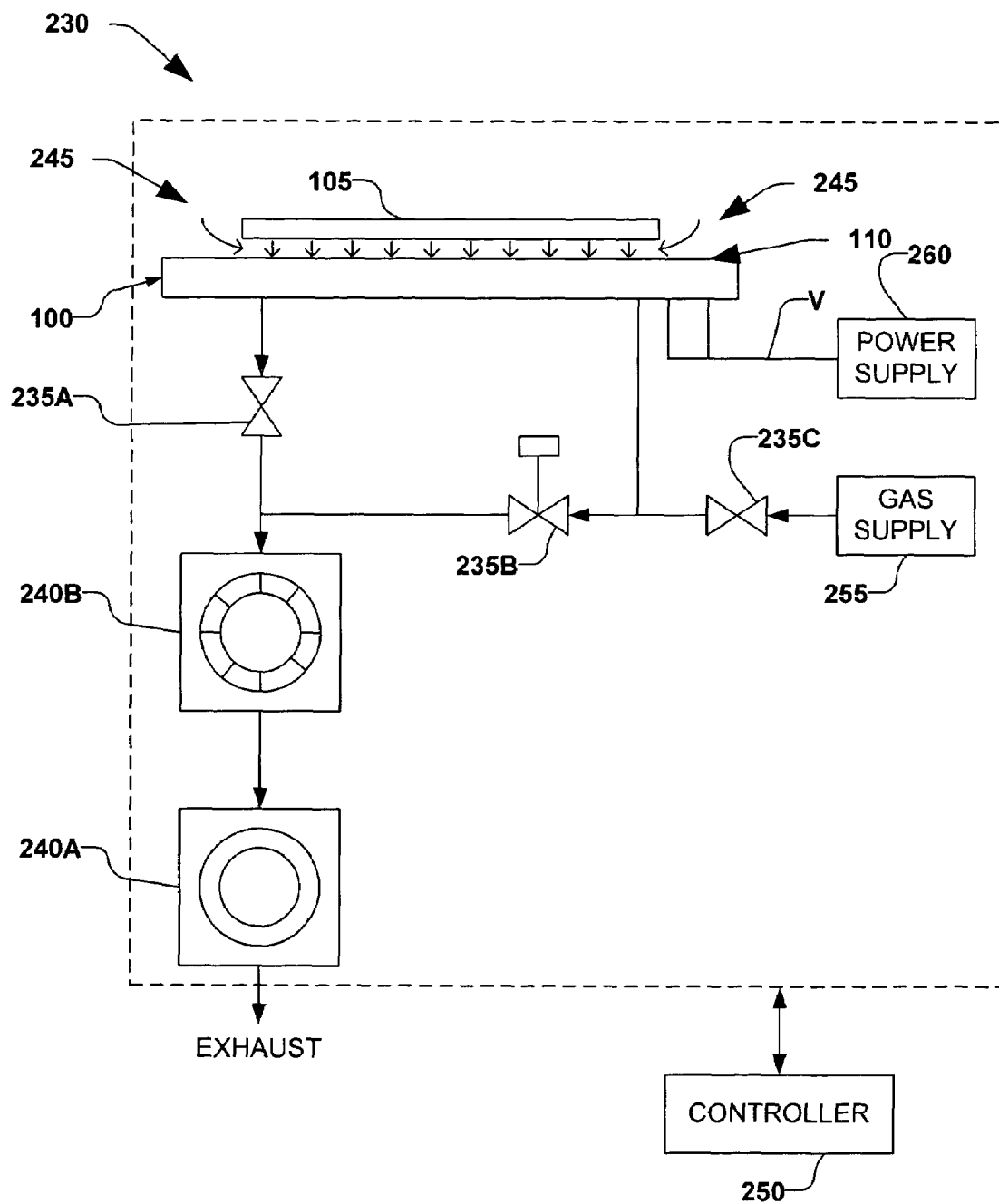
FIG. 14 is a system-level block diagram of an exemplary electrostatic chuck according to an aspect of the present invention.

Referring now to FIG. 14, a block diagram of the electrostatic chuck 100 and a related system 230 is illustrated, wherein the electrostatic chuck further comprises one or more valves 235. The one or more valves 235 selectively permit one or more vacuum pumps 240 to pump the cooling gas 245 through the electrostatic chuck 100 in various modes. The one or more valves 235, for example, comprise one or more automatic valves (e.g., valve 235A) such as fast-acting solenoid valves or poppet valves, wherein, in one example, the one or more automatic valves have a response time of less than about 20 ms. Such a fast response time is advantageous, since the vacuum applied to the electrostatic chuck 100 can be quickly applied.

According to another exemplary aspect of the present invention, the system 230 for controlling the electrostatic chuck comprises a controller 250 operatively coupled to the one or more vacuum pumps 240A–240B, a gas supply 255, a voltage supply 260, and the one or more valves 235A–235C. Controlling the vacuum applied to the electrostatic chuck 100 advantageously controls an amount of thermal conduction through the cooling gas. For example, at low pressures less than about 250 Torr and a gap distance $D_1$ of FIG. 3 of less than about 5 microns, the HTC is dictated primarily by pressure. Therefore the valve 235A that controls the backside pressure allows the electrostatic chuck 100 to quickly change states (e.g., from a heating condition to a cooling condition). The controller 250, therefore, is operable to control a pressure between the substrate 105 and the electrostatic chuck 100 via controlling the one or more automatic valves 235.

Furthermore, the controller 250 is operable to control the voltage V supplied by the voltage supply 260, wherein the voltage is proportional to an amount of clamping force seen by the substrate 105 due to electrostatic forces induced by the voltage. The controller 250, for example, can further control an amount of contact HTC of the ESC 100 by increasing or decreasing the voltage V, whereby the electrostatic force, and hence the clamping force, if respectively increased or decreased. Therefore, the controller is operable to control the HTC of the electrostatic chuck by controlling the voltage V and/or the backside gas pressure. Furthermore, as illustrated in FIG. 3, with a first distance $D_1$ of approximately 1 micron, the voltage V can be maintained well below a breakdown voltage associated with the semiconductor platform (e.g., a voltage of less than approximately 100V–150V).

The present invention is also directed toward a method for forming a semiconductor-based multi-polar electrostatic chuck. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 15:
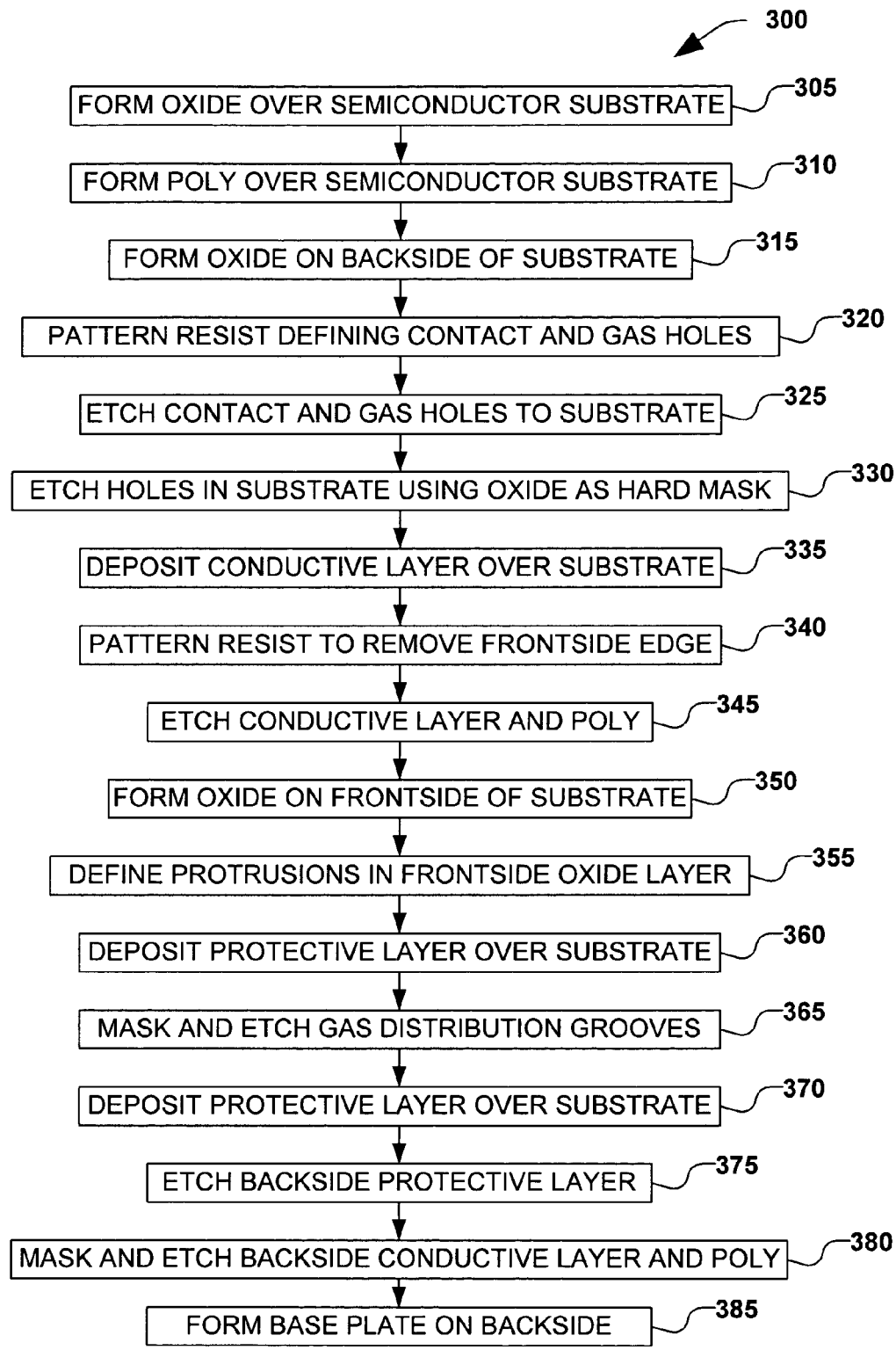
FIG. 15 is a flow chart diagram illustrating an exemplary methodology for forming a semiconductor-based electrostatic chuck according to the present invention.

As illustrated in FIG. 15, a method 300 of forming a multi-polar ESC can be discussed with reference to FIGS. 16A–16S. Beginning with act 305 of FIG. 15, an oxide is formed over a semiconductor substrate. As illustrated in FIG. 16A, the oxide layer 402 is formed over a frontside 404, a backside 406, and a sidewall 408 of the semiconductor substrate 410 (e.g., a 2 micron $SiO_2$ layer grown over a double-polished 300 mm silicon wafer). In act 310 of FIG. 15, a poly film is formed over the substrate. For example, as illustrated in FIG. 16B, the poly film 412 comprises a doped poly-silicon film of approximately 1 micron formed over the frontside 404, backside 406, and sidewall 408 of the substrate 410. In act 315 of FIG. 15, an oxide layer is formed on the backside of the substrate, as further illustrated in FIG. 16C. The oxide 414, for example, comprises a 2 micron deposition of $SiO_2$, wherein the oxide 414 covers the backside 406 of the substrate 410, as well as partially covering the sidewall 408 of the substrate.

Referring again to FIG. 15, act 320 comprises patterning a resist layer to define contact holes and gas holes. FIG. 16D illustrates the resist 416 is patterned over the backside 406 of the substrate 410, wherein the resist generally defines a contact hole 418 and a gas hole 420. Note that the number of contact holes 418 and gas holes 420 illustrated in the figures is shown for simplicity, and numerous contact holes and gas holes may be defined. The contact hole 418, for example, is utilized to define a frontside contact (not shown), as will be discussed hereafter. In act 325 of FIG. 15, the contact hole and gas hole are etched using the patterned resist as a mask, and FIG. 16E illustrates the result, wherein the oxide layers 402 and 414 and the poly film 412 are etched, therein further defining the contact hole 418 and gas hole 420. The resist is subsequently stripped, and in act 330 of FIG. 15, the contact hole and gas hole are further etched in the substrate, using the oxide layer 414, for example, as a hard mask. FIG. 16F illustrates the result of act 330, wherein the substrate 410 is etched, and wherein the oxide layers 402 and 414 are further etched, using the poly film 412 as an etch stop. The oxide layers 402 and 414, can be etched using, for example, a wet etch or a reactive ion etch (RIE) process.

Act 335 of FIG. 15 illustrates a deposition of a conductive layer over the substrate. FIG. 16G illustrates the result of act 335, wherein the conductive layer 422 is deposited over the substrate 410 (e.g., a chemical vapor deposition (CVD) of 0.1 micron of $WSi_2$), including the frontside 404, backside 406, sidewall 408 of the substrate, as well as inside of the contact hole 418 and gas hole 420. The conductive layer 422, for example, may comprise one or more of the first electrically conductive layer 125, the second electrically conductive layer 165, or the third electrically conductive layer 194, as illustrated in FIGS. 2, 12, and 13.

In act 340 of FIG. 15, a photoresist is patterned over the frontside of the substrate for removing a frontside edge of the conductive layer. FIG. 16H illustrates the photoresist 424 formed over the frontside 404 of the substrate 410, wherein the frontside edge 426 is not covered by the photoresist. In act 345 of FIG. 15, the conductive layer and poly film are etched, using the patterned resist 424 as a mask. FIG. 16I illustrates the result of performing act 345, wherein the frontside edge 426 is generally etched, and wherein the conductive layer 422 and poly film 412 are generally removed along the frontside edge 426, therein generally electrically isolating a first electrically conductive layer 428 from a second electrically conductive layer 430. FIG. 16J illustrates the first electrically conductive layer 428 and second electrically conductive layer 430 after the photoresist is removed.

Act 350 of FIG. 15 illustrates the act of forming a frontside oxide over the frontside of the substrate. FIG. 16K illustrates the oxide layer 432 formed over the frontside 404 of the substrate 410, wherein the frontside oxide 432 generally covers the first electrically conductive layer 428 and further generally covers the frontside edge 426. In act 355 of FIG. 15, a plurality of protrusions are formed in the frontside oxide layer. FIGS. 16L–16M illustrate the formation of the plurality of protrusions. In FIG. 16L, a photoresist 434 is deposited and patterned over the frontside oxide layer 432, and the frontside oxide layer is subsequently etched, wherein the plurality of protrusions 436 of FIG. 16M are generally defined after removal of the photoresist 434. Referring again to FIG. 15, act 360 illustrates a deposition of a protective layer over the substrate. In FIG. 16N, the protective layer 438 is generally formed over the substrate 410, wherein the frontside 404, backside 406, and sidewall 408 of the substrate are generally covered by the protective layer, as well as within regions 418 and 420. The protective layer 438, for example, comprises a nitride (e.g., silicon nitride $Si_3N_4$) of approximately 0.1 microns.

In act 365 of FIG. 15, one or more gas distribution grooves are masked and etched in the substrate. FIG. 16O illustrates the patterning of a mask 440 formed over the frontside 404 of the substrate 410, wherein a gas distribution groove 442 is generally defined therein. For example, a relatively thick hard mask 440 such as BSG is formed over the frontside 404 of the substrate, wherein the hard mask is generally easily etched, and wherein the etch is further selective to the protective layer 438 and the oxide layer 402 in the gas distribution groove 442. FIG. 16P illustrates the result of performing act 365, wherein the gas distribution groove 442 is generally etched to the substrate 410 (e.g., the substrate is slightly etched). In act 370 of FIG. 15, another protective layer is formed over the substrate. FIG. 16Q illustrates the result of performing act 370, wherein the protective layer 444 generally covers the topside 404, the backside 406, the sidewall 408, the contact hole 418, the gas hole 420, and the gas distribution groove 442. The protective layer 444 comprises, for example, a 0.2 micron thick layer of silicon nitride.

Act 375 of FIG. 15 illustrates an etching of the protective layer on the backside of the substrate. FIG. 16R illustrates the result of performing act 375, wherein the protective layer 444 is generally removed from the backside 406 of the substrate 410. In act 380 of FIG. 15, the second electrically conductive layer 430 is masked and etched to generally electrically isolate a plurality of poles generally defining the poles of an electrostatic chuck. FIG. 16S illustrates the formation of the mask 446 over the backside 406 of the substrate 410. FIG. 16T illustrates the result of etching the second electrically conductive layer 430 and the poly film 412, wherein the plurality of poles 448 are electrically isolated from one another. In act 385 of FIG. 15, a base plate is generally formed over the backside of the substrate, wherein the base plate is operable to generally transfer heat from the electrostatic chuck. FIG. 16U illustrates the result of performing act 385, wherein the base plate 450 is formed over the backside 406 of the substrate 410. For example, the base plate comprises aluminum which is evaporated onto the backside 406 though a ring mask (not shown) to protect the poly film 412.

Figure 17:
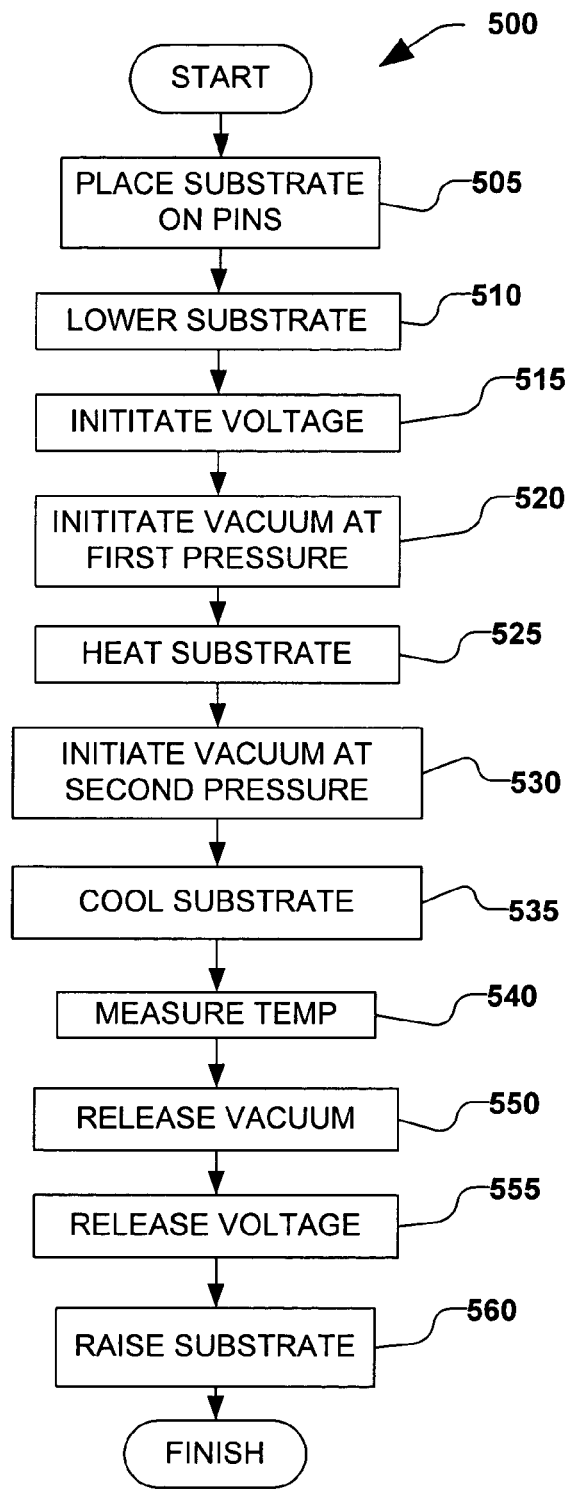
FIG. 17 is a flow chart diagram illustrating an exemplary methodology for thermally processing a semiconductor substrate according to the present invention.
Figure 18:
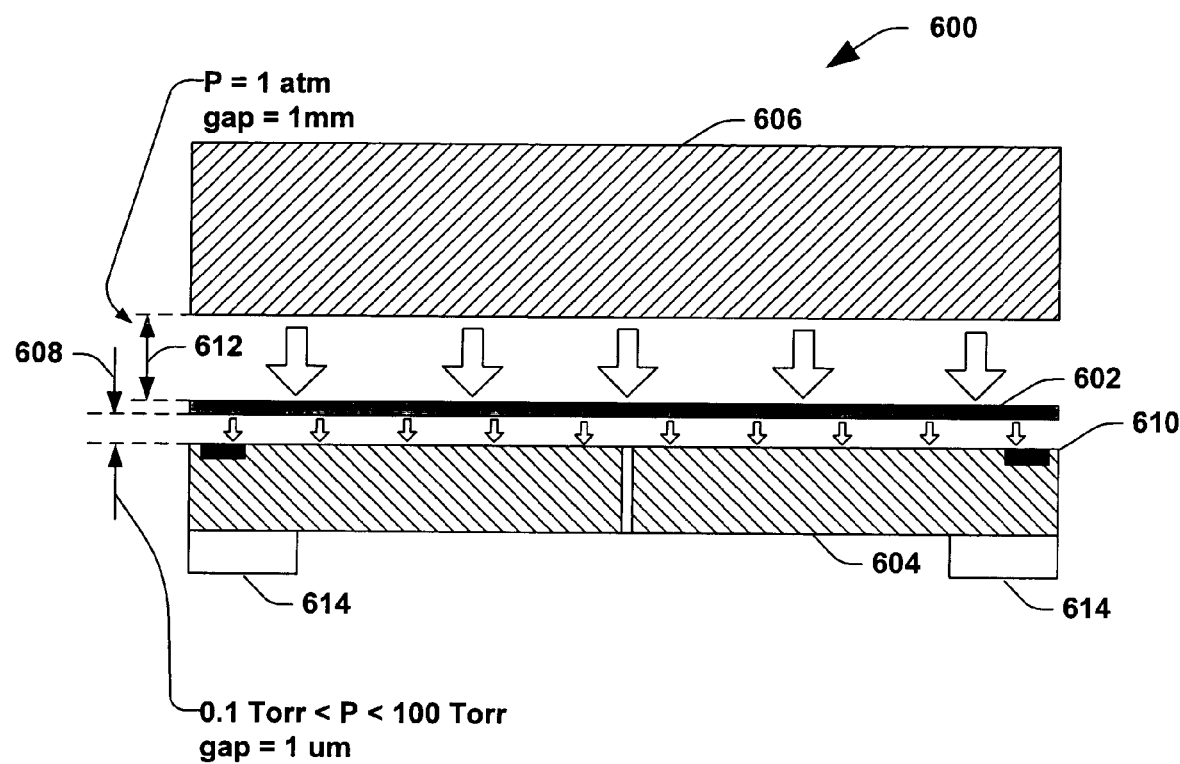
FIG. 18 is a system-level block diagram illustrating a simplified semiconductor processing system employing an electrostatic chuck according to the present invention.

The present invention is also directed toward a method for clamping a semiconductor substrate and controlling a heat transfer associated therewith. Initially, the method 500 of FIG. 17 of the present invention can be discussed in conjunction with the exemplary system 600 of FIG. 18. The system 600 comprises a substrate 602 selectively residing on an electrostatic chuck 604 similar to that described herein. The substrate 602 is also local to a heat source 606. A distance 608 between the substrate 602 and a clamping plate 610 associated with the chuck 604 is small (e.g., about 1 um) which allows gas conduction in the free molecular regime for appropriate pressures (e.g., 0.1 Torr<P<100 Torr). A distance 612 between the heat source 606 and the substrate 602 is relatively large (e.g., about 1 mm or more) and heating of the substrate occurs at relatively higher pressure (e.g., about 1 atmosphere). Thus by electrostatically clamping the substrate and then controlling the backside pressure (as discussed above in conjunction with FIGS. 9 and 10), the system 600 can quickly transition between heating and cooling in an advantageous manner.

The exemplary method 500 of cooling the semiconductor substrate begins at act 505, wherein a substrate is placed on a plurality of lift pins when the lift pins are in a loading position. For example, the plurality of pins extend generally from a surface 614 of FIG. 18 of the clamping plate 610 when the plurality of pins are in the loading position. According to one exemplary aspect of the invention, the plurality of pins extend a minimal distance (e.g., less than 1 mm) from the top surface 614 of the clamping plate when the holder is in the loading position. The pins are then lowered in act 510 of FIG. 17, wherein the substrate is allowed to rest on a plurality of protrusions extending from the top surface of the clamping plate, and wherein one of the plurality of protrusions comprises a ring which generally resides within a perimeter of the substrate on the clamping plate (e.g., as illustrated in FIG. 8). According to one exemplary aspect of the invention, the plurality of protrusions extend a first distance from the surface of the clamping plate, such as a distance of less than 10 microns (e.g., about 1 micron).

A voltage (e.g., approximately 100 volts) is applied to the clamping plate in act 515, wherein the substrate is consequently electrostatically clamped to the clamping plate. According to one example, the clamping plate is cooled, such as by flowing a cooling fluid through the base plate associated with and thermally coupled to the clamping plate. A vacuum or very low backside pressure (e.g., about 0.1 Torr) is applied to the clamping plate in act 520, wherein a backside pressure between the substrate the clamping brings a cooling gas into a plurality of gaps defined by the plurality of protrusions, wherein the cooling gas is generally maintained at a first pressure. Since the backside pressure is extremely low, the HTC of the cooling gas is also very low, as illustrated again in FIG. 7. In act 525 of FIG. 17, the substrate is heated, wherein heat from the substrate does not significantly transfer through the cooling gas at the first pressure. The clamping plate is cooled, such as by flowing a cooling fluid through the base plate associated with and thermally coupled to the clamping plate. In act 530, the pump(s) generally apply a second backside pressure (e.g., about 100 Torr), wherein the second pressure generally maintains the cooling gas in the molecular regime. Such a pressure can be obtained, for example, by closing the valve 235A of FIG. 14. In act 535, the substrate is cooled by transferring heat to the clamping plate in the molecular regime through the gas.

According to one exemplary aspect of the present invention, in act 540, a temperature associated with one or more locations on the substrate is measured. If the determination made in act 545 is such that the process is not cooling in the desired time frame, for example, the second pressure can be modified in accordance with the measured temperature. The process continues to act 550, wherein the vacuum is halted or otherwise decreased, wherein the vacuum is substantially released, thereby substantially halting the cooling of the substrate. In act 555, the voltage is removed from the clamping plate, thereby generally releasing the substrate from the electrostatic force. The method concludes with act 560, wherein the lifting pins are raised into the loading position, wherein the substrate is lifted from the third surface of the clamping plate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A multi-polar electrostatic chuck for clamping a substrate and controlling a heat transfer associated therewith, the electrostatic chuck comprising:
    a clamping plate, the clamping plate further comprising:
        a semiconductor plafform;
        a first electrically conductive layer formed over a top surface of the semiconductor plafform, wherein the first electrically conductive layer comprises a plurality of portions, wherein the plurality of portions are generally electrically isolated from one another, therein defining a plurality of poles associated with the electrostatic chuck; and
        a plurality of electrically insulative protrusions formed over the first electrically conductive layer, the plurality of protrusions extending a first distance from a top surface of the first electrically conductive layer, wherein the plurality of protrusions are operable to generally contact the substrate, therein defining a protrusion contact area that is entirely electrically insulative, and wherein the plurality of protrusions generally define a plurality of gaps therebetween having a second distance associated therewith;
    a base plate operable to transfer thermal energy from the substrate through the clamping plate; and
    a plurality of electrodes electrically connected to the respective plurality of portions of the first electrically conductive layer, wherein the plurality of electrodes are further operable to be connected to a voltage source.

2. The electrostatic chuck of claim 1, wherein the clamping plate further comprises a second electrically conductive layer, the second electrically conductive layer comprising a plurality of vertical interconnects and a plurality of portions formed over a bottom surface of the semiconductor platform, wherein the plurality of portions of the second electrically conductive layer are generally electrically isolated from one another, wherein the second electrically conductive layer is electrically connected to the first electrically conductive layer through the plurality of vertical interconnects, and wherein the plurality of electrodes are electrically connected to the respective plurality of portions of the second electrically conductive layer.

3. The electrostatic chuck of claim 2, wherein the plurality of vertical interconnects comprise a plurality of vias generally extending through the semiconductor platform from the top surface of the semiconductor platform to the bottom surface of the semiconductor platform.

4. The electrostatic chuck of claim 2, wherein the plurality of vertical interconnects are generally formed on a sidewall of the semiconductor platform, wherein the plurality of vertical interconnects are electrically connected to the respective plurality of electrodes.

5. The electrostatic chuck of claim 4, wherein the plurality of electrodes comprises a respective plurality of spring-forced sidewall contact electrodes, wherein the plurality of spring-forced sidewall contact electrodes are operable to electrically contact the respective plurality of vertical interconnects.

6. The electrostatic chuck of claim 2, wherein the base plate comprises a first electrically insulative layer and a third electrically conductive layer formed thereon, wherein the first electrically insulative layer resides between the base plate and the third electrically conductive layer, and wherein the third electrically conductive layer further comprises a plurality of portions electrically isolated from one another, wherein the plurality of portions of the third electrically conductive layer are electrically connected to the respective plurality of portions of the second electrically conductive layer.

7. The electrostatic chuck of claim 6, wherein the third electrically conductive layer generally resides along a sidewall and a top surface of the base plate, and wherein the plurality of electrodes are electrically connected to the respective plurality of portions of the third electrically conductive layer at the sidewall of the base plate.

8. The electrostatic chuck of claim 6, wherein the base plate is comprised of amorphous silicon, aluminum, or copper.

9. The electrostatic chuck of claim 6, wherein the third electrically conductive layer comprises one or more of tungsten silicide, tungsten, or titanium.

10. The electrostatic chuck of claim 6, wherein the first electrically insulative layer is comprised of silicon dioxide.

11. The electrostatic chuck of claim 2, wherein the base plate is generally electrically conductive and comprises a plurality of segments electrically isolated from one another, wherein the plurality of portions of the second electrically conductive layer are electrically connected to the respective plurality of segments of the base plate, and wherein the plurality of electrodes are electrically connected to the respective plurality of segments of the base plate.

12. The electrostatic chuck of claim 11, wherein the base plate is comprised of aluminum, copper, a metal alloy, or amorphous silicon.

13. The electrostatic chuck of claim 2, wherein the second electrically conductive layer comprises one or more of tungsten silicide, tungsten, or titanium.

14. The electrostatic chuck of claim 1, wherein the first electrically conductive layer further comprises a plurality of sidewall interconnects generally formed on a sidewall of the semiconductor platform, wherein the plurality of electrodes are electrically connected to the respective plurality of sidewall interconnects.

15. The electrostatic chuck of claim 14, wherein the plurality of electrodes comprises a respective plurality of spring-forced sidewall contact electrodes, wherein the plurality of spring-forced sidewall contact electrodes are operable to electrically contact the respective plurality of sidewall interconnects.

16. The electrostatic chuck of claim 1, wherein base plate further comprises one or more fluid conduits, wherein a cooling fluid is operable to flow through fluid conduits, therein substantially cooling the base plate.

17. The electrostatic chuck of claim 1, wherein the base plate is vacuum brazed to the clamping plate.

18. The electrostatic chuck of claim 1, wherein the first electrically conductive layer comprises one or more of tungsten silicide, tungsten, or titanium.

19. The electrostatic chuck of claim 1, wherein the base plate is comprised of an electrically conductive material, and wherein the clamping plate is electrically insulated from the base plate.

20. The electrostatic chuck of claim 19, wherein the base plate is comprised of aluminum, copper, a metal alloy, or amorphous silicon.

21. The electrostatic chuck of claim 19, further comprising an intermediate plate, wherein the intermediate plate electrically insulates the clamping plate from the base plate.

22. The electrostatic chuck of claim 21, wherein the intermediate plate comprises an aluminum nitride insulator wafer which is metallized on a top and a bottom surface thereof.

23. The electrostatic chuck of claim 21, wherein the clamping plate is vacuum-brazed to the intermediate plate and the intermediate plate is vacuum-brazed to the base plate.

24. The electrostatic chuck of claim 1, wherein the semiconductor platform is comprised of silicon.

25. The electrostatic chuck of claim 1, wherein the plurality of protrusions are generally comprised of silicon dioxide.

26. The electrostatic chuck of claim 1, wherein the plurality of portions of the first electrically conductive layer are generally electrically isolated from one another by silicon dioxide.

27. The electrostatic chuck of claim 1, wherein the plurality of portions of the first electrically conductive layer are generally electrically isolated from one another by an electrically insulative insert.

28. The electrostatic chuck of claim 1, wherein each of the plurality of protrusions comprises a protection layer formed thereover.

29. The electrostatic chuck of claim 28, wherein the protection layer is comprised of silicon nitride.

30. The electrostatic chuck of claim 1, wherein the plurality of protrusions comprise an array of micro-electromechanical structures.

31. The electrostatic chuck of claim 30, wherein each of the plurality of micro-electromechanical structures has a surface roughness of approximately 0.1 microns or less.

32. The electrostatic chuck of claim 1, further comprising a voltage control system operable to control a voltage to the plurality of electrodes from the voltage source, wherein the voltage is operable to induce an electrostatic force between the clamping plate and the substrate, therein selectively clamping the substrate to the clamping plate.

33. The electrostatic chuck of claim 1, further comprising a pressure control system operable to control a backside pressure of a cooling gas residing within the plurality of gaps between a first pressure and a second pressure, wherein a heat transfer coefficient of the cooling gas is primarily a function of the backside pressure.

34. The electrostatic chuck of claim 33, wherein the first distance is less than or about equal to the mean free path of the cooling gas.

35. The electrostatic chuck of claim 33, wherein the first pressure and second pressure are selected such that a thermal conduction between the substrate and the clamping plate through the cooling gas is in a free molecular regime, wherein the heat transfer coefficient of the cooling gas is primarily a function of the backside pressure and is substantially independent of the first distance.

36. The electrostatic chuck of claim 33, wherein the clamping plate further comprises one or more gas distribution grooves associated with the top surface thereof, the one or more gas distribution grooves extending a third distance into the clamping plate, wherein the third distance is substantially larger than the first distance, and wherein each of the one or more gas distribution grooves intersects one or more of the plurality of gaps, such that a cooling gas flow in a viscous regime is operable to occur therethrough, thereby allowing a cooling of the substrate to be quickly initiated.

37. The electrostatic chuck of claim 36, further comprising a gas conduit fluidly coupled between the pressure control system and at least one of the one or more gas distribution grooves, wherein the gas conduit is operable to permit a range of backside pressures of the cooling gas within the plurality of gaps in response to the pressure control system.

38. The electrostatic chuck of claim 33, wherein one of the plurality of protrusions comprises a ring having a diameter, wherein the diameter of the ring is slightly smaller than a diameter of the substrate, and wherein the ring is generally concentric with the substrate and configured to generally provide a seal between the clamping plate and the substrate, therein defining an internal region of the clamping plate, wherein the cooling gas residing in the internal region of the clamping plate is generally isolated from an external environment.

39. The electrostatic chuck of claim 1, wherein a ratio of the protrusion contact area to a surface area of the substrate is about 0.1 or more.

40. The electrostatic chuck of claim 1, wherein the base plate is thermally coupled to the clamping plate.

41. The electrostatic chuck of claim 1, wherein the first distance is approximately 1 micron.

42. A method of clamping a substrate and controlling a heat transfer associated therewith, the method comprising:
placing the substrate on a clamping plate having a plurality of electrically insulative protrusions extending from a first electrically conductive layer formed over a semiconductor platform, the plurality of protrusions defining a protrusion contact area that is entirely electrically insulative, the plurality of protrusion further defining plurality of gaps therebetween and a first distance between the substrate and a top surface of the first electrically conductive layer, wherein the first distance is associated with a mean free path of a cooling gas within the gaps;

applying a voltage between at least two regions of the first electrically conductive layer, wherein an electrostatic force generally attracts the substrate to the clamping plate; and controlling a pressure of the cooling gas in the gaps, wherein a heat transfer coefficient of the cooling gas within the gaps is primarily a function of pressure and substantially independent of the gap distance.

43. The method of claim 42, wherein controlling the pressure comprises:

achieving a first pressure of the cooling gas within the gaps to achieve a first heat transfer coefficient; and achieving a second pressure of the cooling gas that is greater than the first pressure within the gaps to achieve a second heat transfer coefficient that is greater than the first heat transfer coefficient.

44. The method of claim 43, wherein the first pressure is about 0 Torr and the first heat transfer coefficient is about 0, and wherein the second pressure is between about 100 Torr to about 250 Torr.

45. The method of claim 42, wherein the clamping plate further comprises one or more gas distribution grooves, each of the one or more gas distribution grooves intersecting one or more of the plurality of gaps, the one or more gas distribution grooves being substantially larger than the gaps such that a cooling gas flow therethrough occurs in a viscous regime, thereby allowing a cooling of the substrate to be quickly initiated.

46. The method of claim 45, wherein controlling a pressure in the gaps comprises flowing the cooling gas through the gaps via the one or more gas distribution grooves.

47. The method of claim 42, wherein the voltage is less than 300V.

* * * * *